United States Patent [19]
Nishi

[11] Patent Number: 5,477,304
[45] Date of Patent: Dec. 19, 1995

[54] PROJECTION EXPOSURE APPARATUS

[75] Inventor: Kenji Nishi, Kawasaki, Japan

[73] Assignee: Nikon Corporation, Tokyo, Japan

[21] Appl. No.: 377,504

[22] Filed: Jan. 25, 1995

Related U.S. Application Data

[63] Continuation of Ser. No. 139,803, Oct. 22, 1993, abandoned.

[30] Foreign Application Priority Data

Oct. 22, 1992 [JP] Japan .................................. 4-284371
Oct. 28, 1992 [JP] Japan .................................. 4-289985

[51] Int. Cl.⁶ .......................... G03B 27/42; G03B 27/48; G03B 27/50
[52] U.S. Cl. .............................................. 355/53; 355/50
[58] Field of Search ................................ 355/50, 51, 53, 355/55

[56] References Cited

U.S. PATENT DOCUMENTS 3,538,828  11/1970  Genovese ..................... 95/18
4,747,678  5/1988  Shafer et al. ................. 350/505
4,924,257  5/1990  Jain ............................. 355/53
5,004,348  4/1991  Magome ...................... 356/401
5,227,839  7/1993  Allen ........................... 355/53

Primary Examiner—Richard A. Wintercorn
Attorney, Agent, or Firm—Shapiro and Shapiro

[57] ABSTRACT

Constant speed drive of a reticle and a wafer in a relative scanning direction and positioning of the reticle and the wafer are simultaneously performed with high precision by a slit scanning exposure scheme. A reticle side scanning stage for scanning a reticle relative to a slit-like illumination area in the relative scanning direction is placed on a reticle side base. A reticle side fine adjustment stage for moving and rotating the reticle within a two-dimensional plane is placed on the reticle side scanning stage. The reticle is placed on the reticle side fine adjustment stage. Constant speed drive and positioning of the reticle and a wafer are performed by independently controlling the reticle side scanning stage and the reticle side fine adjustment stage.

34 Claims, 13 Drawing Sheets

PROJECTION EXPOSURE APPARATUS

This is a continuation of application Ser. No. 08/139,803 filed Oct. 22, 1993, now abandoned.

BACKGROUND OF THE INVENTION

1. Field of the Invention

The present invention relates to a projection exposure apparatus used when a semiconductor integrated circuit, a liquid crystal display device, or the like is manufactured and, more particularly, to a projection exposure apparatus for performing exposure by a scanning exposure scheme.

2. Related Background Art

When a semiconductor element, a liquid crystal display element, or the like is to be manufactured by a lithographic process, a projection exposure apparatus is used. This apparatus is designed to project a pattern image of a photomask or reticle (to be generically referred to as a reticle hereinafter) on a photosensitive substrate through a projection optical system. As such an apparatus, a projection scanning type exposure apparatus is known, which is designed to simultaneously scan a reticle and a photosensitive substrate through a projection optical system.

As a conventional exposure apparatus of this type, an apparatus having a reflecting projection optical system with X1 magnification is known. In this apparatus, a reticle stage for holding a reticle and a wafer stage for holding a photosensitive substrate (to be referred to as a wafer hereinafter) are coupled to a common movable column, and the reticle and the wafer are scanned/exposed at the same speed. In such a scanning exposure apparatus (mirror projection aligner) with X1 magnification, if a reticle pattern and a reticle pattern image projected on a wafer do not have a mirror-image relationship, an exposure operation is completed by one-dimensionally scanning an integral movable column in the widthwise direction of arcuated slit illumination light while the reticle and the wafer are aligned and held on the movable column. As is apparent, with a projection system with X1 magnification in which a reticle pattern and a reticle pattern image projected on a wafer have a mirror-image relationship, the reticle stage and the wafer stage must be moved in opposite directions at the same speed.

Another conventional scanning exposure apparatus incorporating a refracting element is also known. In this apparatus, while the projecting magnification is increased or decreased with the refracting element, both the reticle stage and the wafer stage are relatively scanned at a speed ratio corresponding to a magnification. In this case, the projection optical system used is constituted by a combination of a reflecting element and a refracting element or by only a refracting element. An example of the reduction projection optical system constituted by a combination of a reflecting element and a refracting element is disclosed in U.S. Pat. No. 4,747,678.

In addition, a method of performing step & scan exposure by using a reduction projection optical system capable of full-field projection is disclosed in U.S. Pat. No. 4,924,257. In this method, the reticle stage for holding a reticle is designed to be movable in both the X direction as a scanning direction and the Y direction perpendicular to the scanning direction. Similarly, the wafer stage for holding a wafer is designed to be movable in both the X and Y directions. As disclosed in U.S. Pat. No. 5,004,348, the wafer stage and the reticle stage of an exposure apparatus based on the widely used conventional step and repeat scheme are also designed to be movable in both the X and Y directions. A conventional scanning exposure apparatus may use the wafer and reticle stages of the above-described exposure apparatus of the step and repeat scheme so as to perform control to synchronously scan the two stages in the X direction as the scanning direction. In this case, while a wafer and a reticle are scanned in the X direction, the wafer stage and the reticle stage are finely moved within the X–Y plane to adjust the positions of the wafer and the reticle in the X and Y directions and the direction of rotation, thereby correcting the position deviation of the wafer relative to the reticle. Both the stages, however, are relatively heavy. For this reason, they are poor in response characteristics and require complicated control. That is, in a conventional scanning exposure apparatus, it is difficult to perform constant speed drive control in the scanning direction and simultaneously perform high-precision control of positioning operations in the X and Y directions and the direction of rotation.

As the above-described scanning exposure apparatus, a projection exposure apparatus based on a scanning exposure scheme designed to perform stitching is known (U.S. Pat. No. 3,538,828). In this scanning exposure scheme designed to perform stitching, exposure light having a predetermined shape is radiated on a reticle, and the reticle and a wafer are synchronously scanned, thereby performing exposure with respect to an area corresponding to the first column on the wafer.

Subsequently, the reticle is replaced or is moved in the second direction perpendicular to the first direction of the illumination area by a predetermined amount. The wafer is laterally shifted (stitching) in a direction conjugate to the second direction of the illumination area. Exposure light is radiated on the reticle again, and the reticle and the wafer are synchronously scanned, thus performing exposure with respect to an area corresponding to the second column on the wafer. With this operation, one shot area, on the wafer, which can be exposed can be further increased. In this case, the moving amount of the wafer in the second direction is set such that the exposure areas of the first and second columns on the wafer overlap each other.

In such an exposure apparatus, high-precision overlapping of patterns and a reduction in illuminance irregularity at the overlapping portion between the areas of the first and second columns are required. However, these requirements are not satisfied by the conventional exposure apparatus.

The following problem is posed even in an exposure apparatus having a regular hexagonal illumination area such as the one disclosed in U.S. Pat. No. 4,924,257.

FIG. 14A shows an illumination area on a reticle in a projection exposure apparatus of a stitching and slit scanning exposure scheme. Referring to FIG. 14A, exposure light from an illumination optical system is radiated on a regular hexagonal illumination area 1 centered on a position A. The illuminance in the illumination area 1 is uniform. By scanning the reticle in the −X direction with respect to the illumination area 1 at the position A at a constant speed V/β, the illumination area 1 relatively moves over the reticle along a trace 2A and reaches a position B. The reticle is then moved in the Y direction to relatively move the illumination area 1 over the reticle along a trace 2B, thus causing the illumination area 1 to reach a position C. Thereafter, the reticle is scanned in the X direction at the constant speed V/β to relatively move the illumination area 1 over the reticle along a trace 2C.

FIG. 14B shows an exposure area on a wafer. Referring to FIG. 14B, a regular hexagonal exposure area 3 centered on a position AP is conjugate to the illumination area 1 at the position A on the reticle. The regular hexagonal exposure area 3 has two sides parallel to the Y direction. Letting R be the distance between two opposing vertexes of the regular hexagonal exposure area 3, and W be the distance between two opposing sides thereof, $W=3^{1/2}R/2$. When the wafer is scanned in the X direction with respect to the exposure area 3 at the position AP at a constant speed V, the exposure area 3 relatively moves over the wafer along a trace 2AP and reaches a position BP. In this state, when the wafer is moved in the −Y direction by a distance 3R/4, the exposure area 3 relatively moves over the wafer along a trace 2BP and reaches a position CP. Thereafter, when the wafer is scanned in the −X direction at the constant speed V, the exposure area 3 relatively moved over the wafer along a trace 2CP.

The exposure area 3 which relatively moves along the trace 2AP and the exposure area 3 which relatively moves along the trace 2CP are scanned in the Y direction, i.e., the widthwise direction, such that their isosceles triangle areas are superposed on each other in a connection area 4.

FIG. 15A shows a case where a regular hexagonal exposure area 3 is illuminated with a pulse laser beam from a pulse laser source. Referring to FIG. 15A, the exposure area 3 is an area inscribed in the contour of a circular exposure area 7, of a projection, optical system, located on a wafer. Similar to equation (4) in the second embodiment, if the width of the exposure area 3 in the X direction as a relative scanning direction is represented by W, $W=m \cdot \Delta L=m \cdot T \cdot V$ where T is the period of pulse emission of a pulse laser source 52 in FIG. 6, $\Delta L$ is the distance by which a wafer 14 is scanned in the X direction during one period T in a slit scanning exposure operation, and m is an integer larger than one.

FIG. 15A shows a case where m=8. Assume that an exposure point P0 is located at an edge portion of the exposure area 3 when pulse emission occurs. The exposure point P0 is exposed to a pulse laser beam seven times within the exposure area 3, and is exposed to a pulse laser beam twice at the edge portion. In this case, since the energy exposed at the edge portion is ½ that exposed within the exposure area 3, energy corresponding to a total of eight pulses is radiated on the exposure point P0. Energy corresponding to a total of eight pulses is radiated on the exposure point P0 regardless of the X-direction position of the exposure point P0 at the time of pulse emission.

Consider an exposure point through which an area 3a of the right-hand isosceles triangle of the exposure area 3 passes. The distances by which exposure points P1 to P8 shown in FIG. 15A pass through the area 3a of the isosceles are 8·ΔL to 1ΔΔL, respectively. Therefore, when the wafer is scanned in the X direction with respect to the exposure area 3 (the first wafer scanning operation), energy corresponding to eight pulses is radiated on the exposure point P1, and energies corresponding to seven pulses, six pulses, . . . are respectively radiated on the exposure points P2, P3, . . . .

When stitching of the wafer is performed, and the wafer is scanned in the −X direction with respect to the exposure area 3 (the second wafer scanning operation), energies corresponding to 0 to seven pulses are respectively exposed on the exposure points P1 to P8. Therefore, energy corresponding to eight pulses is radiated on the exposure points P1 to P8, similar to the exposure point P0, by performing exposure twice upon stitching, as in the second embodiment.

However, at an exposure point P9 between the exposure points P4 and P5, even if slit scanning exposure is performed twice, radiated energy varies. That is, as shown in FIG. 15B, pulse emission is performed when the exposure point P9 is at a position 8 in the first wafer scanning operation, and pulse emission is performed when the exposure point P9 is at a position 9 in the second wafer scanning operation. Therefore, energy corresponding to nine pulses is radiated on the exposure point P9.

In the case shown in FIG. 15C, in the first wafer scanning operation, pulse emission is performed when the exposure point P9 is at a position 10, and in the second wafer scanning operation, pulse emission is performed when the exposure point P9 is at a position 11. Therefore, energy corresponding to seven pulses is radiated on the exposure point P9. That is, energy corresponding to seven to nine pulses is radiated on the exposure point P9 depending on the timing of pulse emission. Consequently, at the connection portion 4 on the wafer, radiated energy irregularity, i.e., illuminance irregularity, is caused owing to a pulse laser beam.

SUMMARY OF THE INVENTION

It is the first object of the present invention to provide a scanning exposure apparatus which can drive a reticle and a wafer in a predetermined direction at a constant speed while controlling their positions with high precision. It is the second object of the present invention to realize a high-precision pattern overlapping operation and reduce illuminance irregularity at a connection portion, on a photosensitive substrate, which is scanned and exposed twice by a stitching operation in a scanning exposure apparatus designed to perform a stitching operation.

In order to achieve the first object, according to the present invention, an exposure apparatus for exposing a pattern of a mask onto a photosensitive substrate comprises the following components, as shown in FIG. 1:

synchronous scanning means (20, 23, 24, 27, 31) for synchronously scanning the mask (7) and the photosensitive substrate (14) while maintaining a predetermined speed ratio, when the pattern of the mask (7) is exposed onto the photosensitive substrate (14); and adjusting means (21) for adjusting a position of the mask (7) within a predetermined reference plane parallel to a scanning direction of the mask (7), independently of scanning of the mask (7) which is performed by the synchronous scanning means (20, 23, 24, 27, 31), during scanning exposure of the pattern of the mask (7) onto the photosensitive substrate (14).

According to the exposure apparatus of the present invention, when the pattern of the mask (7) is to be scanned/exposed on the photosensitive substrate (14), the synchronous scanning means (20, 23, 24, 27, 31) synchronously scans the mask (7) and the photosensitive substrate (14). The adjustment means (21) adjusts the position of the mask (7) independently of this scanning operation with respect to the mask (7) and the photosensitive substrate (14). Therefore, the position deviation of the mask (7) relative to the photosensitive substrate (14) during a scanning exposure operation can be corrected with high precision.

In addition, in order to achieve the first object, an exposure apparatus according to the present invention comprises the following components, for example, as shown in FIG. 1:

an illumination optical system (22) for radiating exposure light on a predetermined illumination area on a mask (7) on which a pattern to be transferred is formed;

a projection optical system (13) for projecting an image of a pattern on the mask (7), irradiated with the exposure light, onto a photosensitive substrate (14);

a mask stage (20) for scanning the mask (7) relative to the illumination area in a direction perpendicular to an optical axis of the projection optical system (13);

a substrate stage (27) for scanning the photosensitive substrate (14) relative to the projected image of the pattern in a direction perpendicular to the optical axis of the projection optical system (13);

mask position detecting means (35) for detecting a position of the mask (7) within a plane perpendicular to the optical axis of the projection optical system (13);

substrate position detecting means (47) for detecting a position of the photosensitive substrate (14) within a plane perpendicular to the optical axis of the projection optical system (13);

adjustment means (21) for adjusting the position of the mask (7) within the plane perpendicular to the optical axis of the projection optical system (13); and control means (23) for causing the mask stage (20) and the substrate stage (27) to synchronously scan when the pattern of the mask (7) is exposed on the photosensitive substrate (14), calculating a position deviation of the mask (7) relative to the photosensitive substrate (14) on the basis of detection signals from the mask position detecting means (35) and the substrate position detecting means (47), and causing the adjustment means (21) to adjust the position of the mask (7), independently of a scanning operation with respect to the mask (7) which is performed by the mask stage (20), on the basis of the position deviation.

According to the exposure apparatus of the present invention, the drive section for driving the mask (7) is divided into the mask stage (20), which is scanned in synchronism with the substrate stage (27), and the adjustment means (21) for adjusting the position of the mask (7), and these two drive means are independently controlled. Therefore, as the mask stage (20), for example, a heavy stage which can stably move at a constant speed in a scanning operation is used. As the adjustment means (21), for example, a lightweight stage with high controllability is used, which is capable of fine movement in a translation direction and a rotational direction. With this arrangement, scanning exposure can be performed with excellent positional controllability.

In order to achieve the second object, an exposure apparatus according to the present invention comprises the following components, for example, as shown in FIG. 6:

synchronous scanning means (23, 31, 66) for synchronously scanning a mask (7) and a photosensitive substrate (14) in a predetermined first direction of an illumination area (43) while maintaining a predetermined speed ratio; and illumination condition setting means (53, 55) for setting the illumination area (43) to be rectangular, and letting a light intensity distribution of the illumination area (43) in a second direction perpendicular to the first direction have a trapezoidal shape so that a middle portion of the distribution exhibits a substantially constant light intensity, and two side portions of the distribution exhibit a gradually decreasing light intensity.

According to the exposure apparatus of the present invention, the light intensity distribution of the illumination area (43) in the second direction perpendicular to the first direction in which the mask (7) and the photosensitive substrate (14) are relatively scanned has a trapezoidal shape. Consequently, as shown in FIG. 9B, the light intensity distribution of an exposure area (43 P), which is located on the photosensitive substrate (14) and conjugate to the illumination area (43), in the second direction (y direction) also has a trapezoidal shape. In addition, the width of the exposure area (43 P) in the relative scanning direction is constant. Therefore, exposure points which are arranged on the photosensitive substrate (14) in the second direction and relatively scanned by the exposure area (43 P) are irradiated with exposure light corresponding to the same number of pulses.

When the exposure area (43 P) is to be laterally shifted on the photosensitive substrate (14) by stitching, areas (43 aP, 43 bP) in which the illuminance gradually decreases are superposed on each other, as shown in FIG. 10A. With this operation, at an exposure point Q3 on a connection portion (80c) which is scanned twice by stitching, the sum of a light intensity SA in the first scanning operation and a light intensity SB in the second scanning operation becomes equal to a light intensity SC of a portion, of the trapezoidal light intensity distribution, in which the light intensity is constant, as shown in FIG. 10B. Therefore, the light intensity at an arbitrary point on the connection portion (80c) on the photosensitive substrate (14) becomes almost equal to the light intensity at an exposure point on a non-connection portion, thereby reducing the illuminance irregularity.

In addition, in order to achieve the second object, a projection exposure apparatus according to the present invention comprises the following components, for example, as shown in FIG. 6:

a pulse light source (52) for pulse-emitting exposure light;

an illumination optical system (53, 55, 58) for illuminating a predetermined illumination area (43) on a mask, on which a pattern to be transferred is formed, with the exposure light;

a projection optical system (13) for projecting an image of the pattern, irradiated with the exposure light, onto a photosensitive substrate (14);

synchronous scanning means (23, 31, 66) for synchronously scanning a mask (7) and a photosensitive substrate (14) at least twice in a predetermined first direction of the illumination area (43) while maintaining a predetermined speed ratio;

substrate moving means (28) for moving the photosensitive substrate (14) in a second direction perpendicular to the first direction while first and second scanning operations with respect to the mask (7) and the photosensitive substrate (14) are performed by the synchronous scanning means (23, 31, 66); and control means for controlling at least one of said pulse light source (52) and said synchronous scanning means (23, 31, 66) such that a position of the photosensitive substrate (14) in the first direction at the time when the light source (52) performs pulse emission, in the first scanning operation with respect to the photosensitive substrate (14) and the mask (7) coincides with that in the second scanning operation.

According to the projection exposure apparatus of the present invention, as shown in FIG. 16A, when the photosensitive substrate (14) is scanned by, for example, a regular hexagonal exposure area (3), the position (8) of pulse emission of exposure light with respect to an arbitrary exposure point P9 on a connection area (4) in the first scanning operation is the same as the position (12) of pulse emission of exposure light in the second scanning operation. In the case shown in FIG. 16A, energy corresponding to eight pulses is radiated on the exposure point P9. In the case shown in FIG. 16B, the timing of pulse emission is shifted from that in the case shown in FIG. 16A. However, similar to the case shown in FIG. 16A, the position (10) of pulse emission of exposure light with respect to the exposure point P9 in the first scanning operation is the same as the position (13) of pulse emission of exposure light in the second scanning operation. In the case shown in FIG. 16B, energy corresponding to eight pulses is also radiated on the exposure point P9. That is, by setting the photosensitive substrate at the same position in the scanning direction when the pulse light source performs pulse emission in the first and second scanning operations, the connection portion (4) which is scanned twice by stitching is always irradiated with constant energy, thereby reducing the illuminance irregularity.

DETAILED DESCRIPTION OF THE PREFERRED EMBODIMENTS

A projection exposure apparatus according to the first embodiment of the present invention will be described below with reference to FIGS. 1 to 5B.

Figure 1:
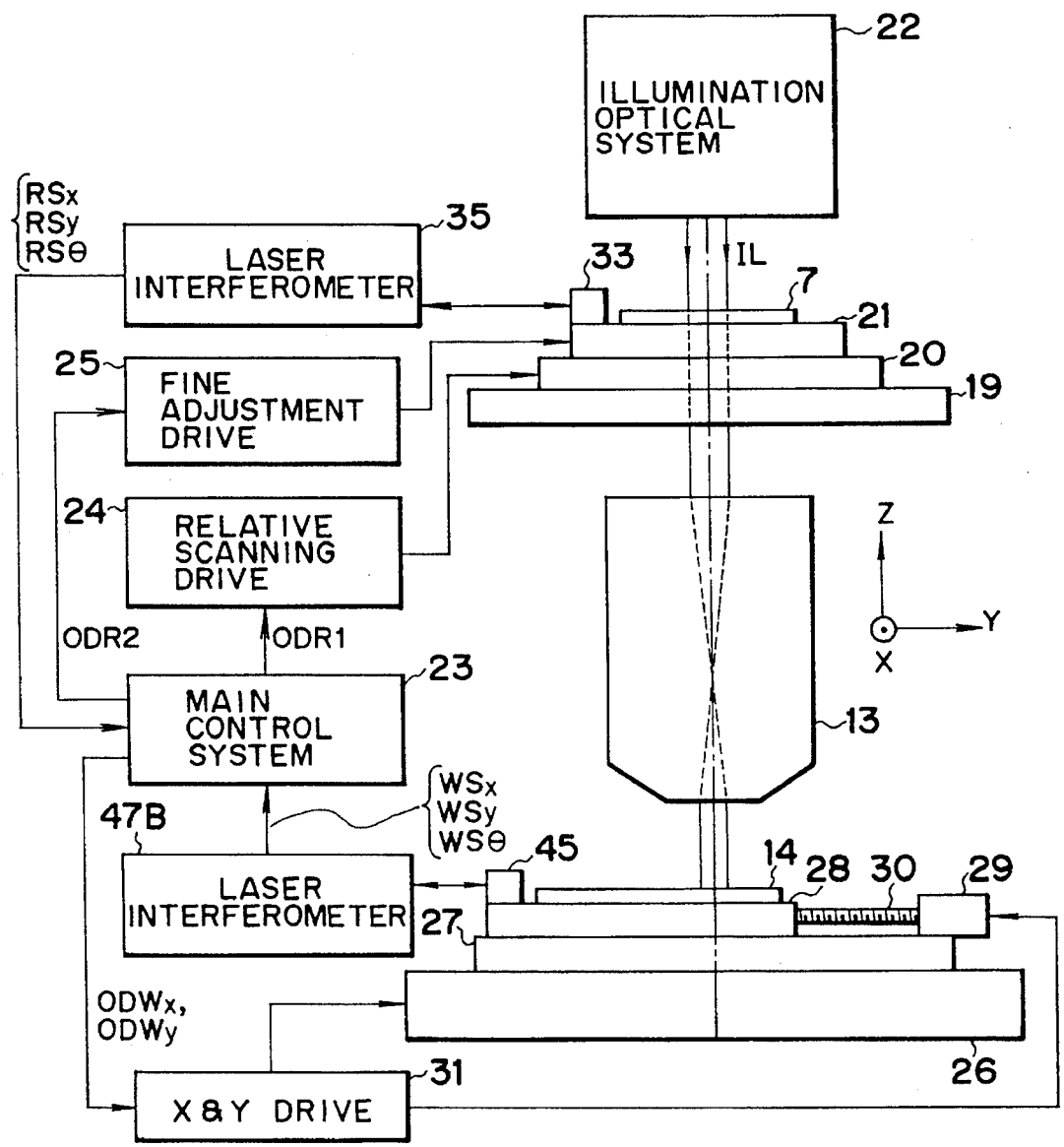
FIG. 1 is a view showing the overall arrangement of a projection exposure apparatus according to the first embodiment of the present invention.

FIG. 1 shows a projection exposure apparatus of a slit scanning exposure scheme according to this embodiment. Referring to FIG. 1, the X axis is defined in a direction perpendicular to the drawing surface of FIG. 1 within a plane parallel to a reticle 7, the Y axis is defined in a direction parallel to the drawing surface of FIG. 1, and the Z axis is defined in a direction perpendicular to the X—Y plane. Assume that a relative scanning direction in slit scanning exposure is defined as the X direction.

An air guide elongated in the X direction is formed on a reticle side base 19 in a stage system for a reticle 7. A reticle side scanning stage 20 is placed on the reticle side base 19 to be slidable in the X direction within the X—Y plane. A reticle side fine adjustment stage 21 is placed on the reticle side scanning stage 20 so as to be translated and rotated within the X—Y plane. The reticle 7 is held on the reticle side fine adjustment stage 21. In an exposure operation, a pattern area of the reticle 7 is illuminated with exposure light IL from an illumination optical system 22 in the form of a rectangular illumination area (to be referred to as a slit-like illumination area hereinafter), and the reticle 7 is scanned in the X direction with respect to the slit-like illumination area. The illumination optical system 22 is constituted by a light source, a shutter, an optical integrator, a field stop for setting the slit-like illumination area, a condenser lens, and the like.

Three movable mirrors (only a movable mirror 33 is shown in FIG. 1) are disposed on the reticle side fine adjustment stage 21. Three laser interferometers (only a laser interferometer 35 is shown in FIG. 1) obtain the positions and rotational angles of the reticle side fine adjustment stage 21 within the X—Y plane by using laser beams reflected by these three movable mirrors. The measurement results obtained by these laser interferometers are supplied to a main control system 23. The main control system 23 controls the operation of the reticle side scanning stage 20 through a relative scanning drive 24, and also controls the operation of the reticle side fine adjustment stage 21 through a fine adjustment drive 25.

In an exposure operation, a pattern in a slit-like illumination area on the reticle 7 is projected/exposed on the wafer 14 through a projection optical system 13.

In a stage system for the wafer 14, an air guide elongated in the X direction is formed on a wafer side base 26, and a wafer side X stage 27 is placed on the wafer side base 26 to be slidable in the X direction within the X—Y plane. A wafer side Y stage 28 is placed on the wafer side X stage 27 so as to be movable in the Y direction within the X—Y plane. The wafer 14 is held on the wafer side Y stage 28. Although not shown, a Z stage, a leveling stage, and the like are arranged between the wafer side Y stage 28 and the wafer 14. A stepping motor 29 is disposed on one end of the wafer side X stage 27. The stepping motor 29 drives the wafer side Y stage 28 in the Y direction through a ball screw 30.

Three movable mirrors (only a movable mirror 45 is shown in FIG. 1) are disposed on the wafer side Y stage 28. Three laser interferometers (only a laser interferometer 47B is shown in FIG. 1) obtain the positions and rotational angles of the wafer side Y stage 28 within the X—Y plane by using laser beams reflected by these three movable mirrors. The measurement results obtained by these laser interferometers are also supplied to the main control system 23. In accordance with the three position measurement results, the main control system 23 controls the operations of the wafer side X stage 27 and the wafer side Y stage 28 through a drive 31.

Figure 2:
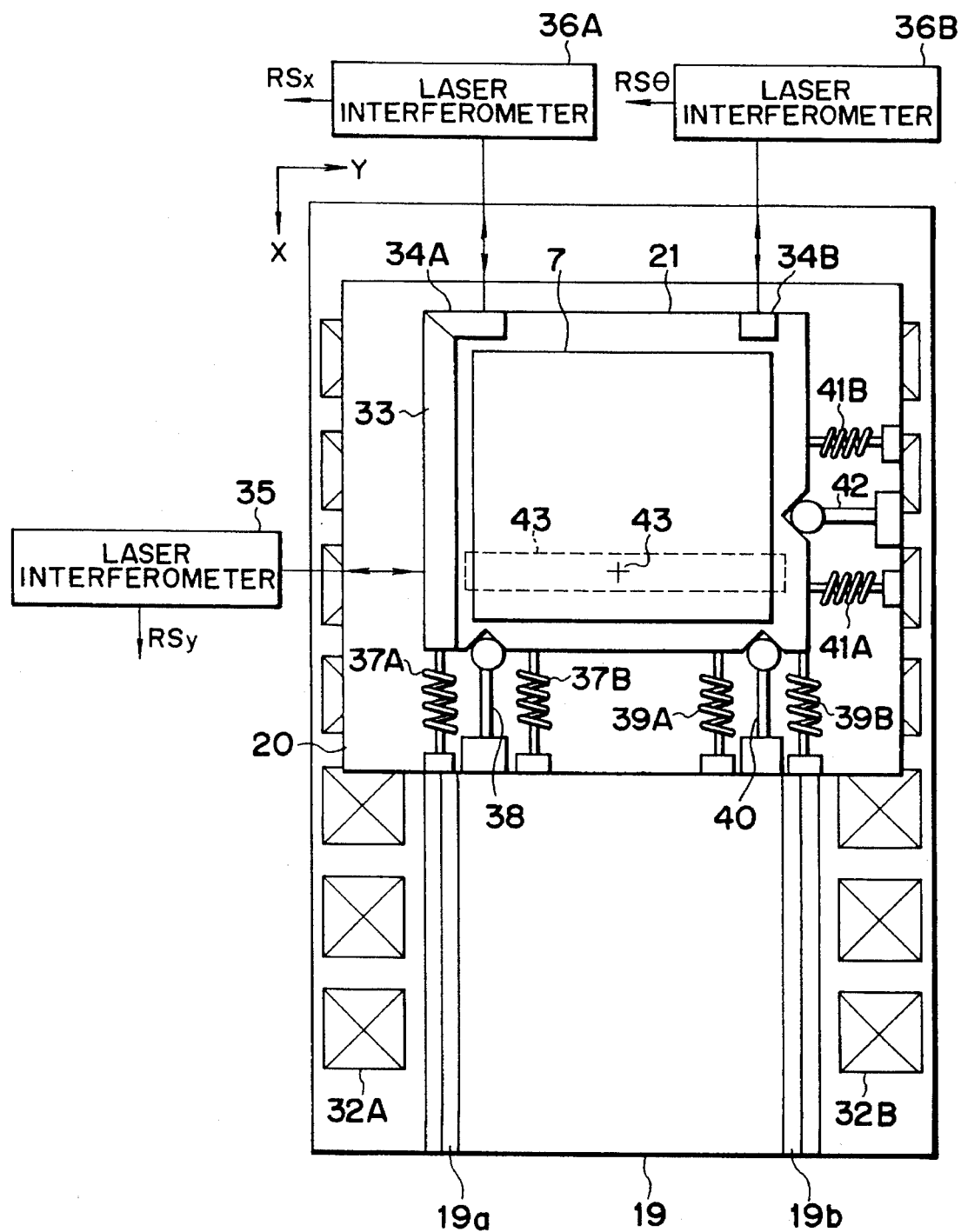
FIG. 2 is a plan view showing a reticle side stage system in FIG. 1.

FIG. 2 is a plan view showing a reticle stage system in FIG. 1. Referring to FIG. 2, two pairs of air guides 19a and 19b are formed, in rows, on the reticle side base 19 to extend in the X direction, and electromagnets 32A and 32B are embedded on two sides of the air guides 19a and 19b in rows in the X direction, respectively. Permanent magnets are embedded in the rear surface of the reticle side scanning stage 20 so that the reticle side scanning stage 20 is driven in the X direction by a linear motor scheme. A cooling function (e.g., a scheme of circulating a temperature-controlled gas or fluid) is provided for the reticle side scanning stage 20 to prevent heat generated by the linear motor from being conducted to the reticle side fine adjustment stage 21. The reticle side fine adjustment stage 21 is placed on the reticle side scanning stage 20. The movable mirror 33 having a reflecting surface perpendicular to the Y axis and elongated in the X direction is disposed on an end portion, of the reticle side fine adjustment stage 21, in the Y direction. Movable mirrors 34A and 34B, each having a reflecting surface perpendicular to the X axis, are disposed on two end portions, of the reticle side fine adjustment stage 21, in the X direction.

The Y-axis laser interferometer 35 is fixed on the reticle side base 19 to oppose the movable mirror 33. Similarly, an X-axis laser interferometer 36A is fixed on the reticle side base 19 to oppose the movable mirror 34A. A laser interferometer 36B for rotation measurement is fixed on the reticle side base 19 to oppose the movable mirror 34B. Y-coordinate data RSy, X-coordinate data RSx, and rotational angle data RSθ of the reticle side fine adjustment stage 21, which are respectively obtained by the Y-axis laser interferometer 35, the X-axis laser interferometer 36A, and the rotation measurement laser interferometer 36B, are supplied to the main control system 23 in FIG. 1.

Actuators 38, 40, and 42 are disposed on the reticle side scanning stage 20 in FIG. 2. The actuators 38 and 40 finely adjust the reticle side fine adjustment stage 21 in the X direction. The actuator 42 finely adjusts the reticle side fine adjustment stage 21 in the Y direction. The positions at which the actuators 38 and 40 are in contact with the reticle side fine adjustment stage 21 are almost symmetrical with the movable mirrors 34A and 34B. The reticle side fine adjustment stage 21 is biased toward the actuators 38, 40, and 42 through three pairs of springs 37A and 37B, 39A and 39B, and 41A and 41B. By adjusting the displacement amounts of the three actuators 38, 40, and 42, the reticle side fine adjustment stage 21 and the reticle 7 can be moved and rotated within the X-Y plane.

A slit-like illumination area 43 elongated in the Y direction is formed on the reticle 7 by the exposure light IL. The optical axis of the Y-axis laser interferometer 35 is set on a straight line which passes a center 43A of the illumination area 43 and is parallel to the Y axis. When the reticle 7 is to be rotated, it must be rotated about the center 43A of the illumination area 43 as an axis. However, when the reticle 7 is scanned in the X direction, the position, of the reticle 7, corresponding to the center 43A changes. For this reason, the rotational center of the reticle 7 is shifted in accordance with the position of the center 43A by adjusting the displacement amounts of the three actuators 38, 40, and 42.

Figure 3:
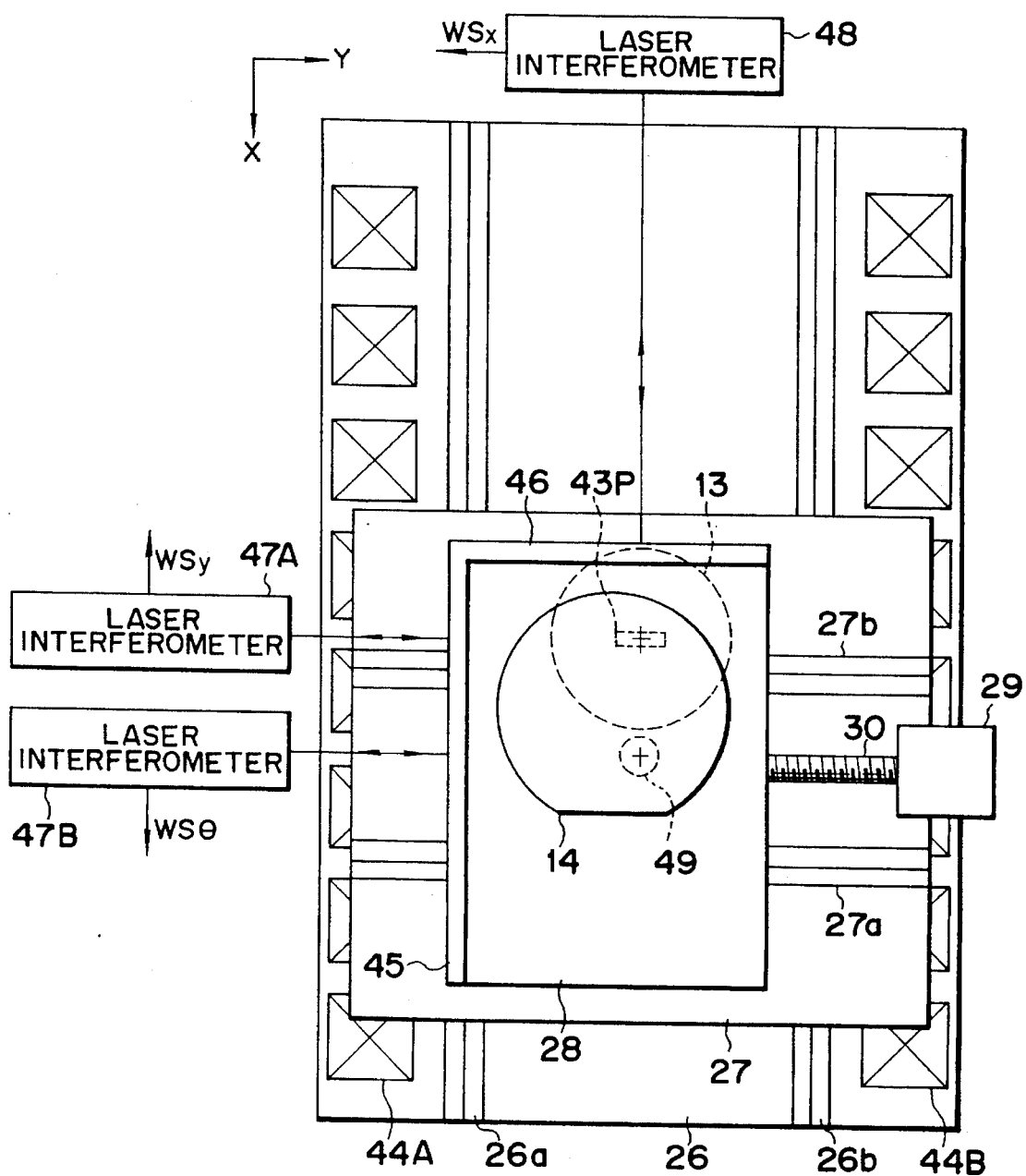
FIG. 3 is a plan view showing a wafer side stage system in FIG. 1.

FIG. 3 is a plan view showing a wafer stage system. Referring to FIG. 3, two pairs of air guides 26a and 26b are formed, in rows, on the wafer side base 26 to extend in the X direction. Electromagnets 44A and 44B are embedded on two sides of the air guides 26a and 26b in rows in the X direction, respectively. The wafer side X stage 27 is placed on the air guides 26a and 26b. The wafer side Y stage 28 is placed on the wafer side X stage 27. Permanent magnets are embedded in the rear surface of the wafer side X stage 27 so that the wafer side X stage 27 is driven in the X direction with high precision by a linear motor scheme. A cooling function is provided for the wafer side X stage 27 to prevent heat generated by the linear motor from being conducted to the wafer side Y stage 28. In addition, two pairs of air guides 27a and 27b are formed, in rows, on the wafer side X stage 27 to extend in the Y direction. The wafer side Y stage 28 is driven along these air guides 27a and 27b in the Y direction by the stepping motor 29.

The movable mirror 45 having a reflecting surface which is perpendicular to the Y axis and is elongated in the X direction is disposed on an end portion, of the wafer side Y stage 28, in the Y direction. A movable mirror 46 having a reflecting surface which is perpendicular to the X axis and is elongated in the Y direction is disposed on an end portion, of the wafer side Y stage 28, in the X direction. A Y-axis measurement laser interferometer 47A and the rotation measurement laser interferometer 47B are fixed on the wafer side base 26 so as to oppose the movable mirror 45 and be separated from each other by the X direction by a predetermined distance. Similarly, an X-axis measurement laser interferometer 48 is fixed on the wafer side base 26 so as to oppose the movable mirror 46. Y-coordinate data WSy, X-coordinate data WSx, and rotational angle data WSθ of the wafer side Y stage 28, which are respectively obtained by the Y-axis measurement laser interferometer 47A, the X-axis laser interferometer 48, and the rotation measurement laser interferometer 47B, are supplied to the main control system 23 in FIG. 1.

In this case, the optical axis of the projection optical system 13 is located at the intersection between the optical axis of the laser interferometer 47A and the optical axis of the laser interferometer 48. An off-axis alignment system 49 is arranged on the side, of the projection optical system 13, in the Y direction. The detection center of the alignment system 49 is located on the optical axis of the laser interferometer 47B, and the optical axis of the laser interferometer 48 is located on a straight line which passes the detection center of the alignment system 49 and is parallel to the X axis. An area of a conjugate image formed on the wafer 14 by the projection optical system 13 and corresponding to the slit-like illumination area 43 shown in FIG. 2 is a slit-like exposure area 43 P elongated in the Y direction. Note that since the Y-direction side portions of the illumination area 43 are slightly vignetted by the light-shielding portion of the reticle 7, the Y-direction length of the exposure area 43 P is smaller than that of the conjugate image of the illumination area 43 itself.

A method of controlling the reticle stage system and the wafer stage system in a slit scanning exposure operation in this embodiment will be described next.

In general, a pattern of the reticle 7 is reduced/projected on the wafer 14. This is because reduction projection is advantageous in managing the dimensions of a pattern of the reticle 7, dust, and the like. If, however, the projecting magnification of the projection optical system 13 is set to be β, the reticle side stage must be driven at high speed by an amount corresponding to a multiple of the reciprocal of the projecting magnification D with respect to the wafer side stage in a slit scanning exposure operation. In many cases, therefore, the processing performance with respect to relative scanning and stage control in an exposure operation depends on the drive performance of the reticle side stage.

The main control system 23 in FIG. 1 issues an X-direction drive command ODWx and a Y-direction drive command ODWy to the drive 31 to move the wafer 14 in the X and Y directions, respectively. The X- and Y-direction drive commands ODWx and ODWy serve to control the operations of linear motors for the wafer side X stage 27 and the stepping motor 29, respectively. The main control system 23 issues a first drive command ODR1 to the scanning drive 24 to move the reticle 7 in the X direction as a relative scanning direction, and also issues a second drive command ODR2 to the fine adjustment drive 25 to move and rotate the reticle 7 within the X—Y plane. The first drive command ODR1 controls the operation of the linear motor for the reticle side scanning stage 20, and the second drive command ODR2 controls the operations of the three actuators 38, 40, and 42 (see FIG. 2) of the reticle side fine adjustment stage 21.

A control method will be described below with reference to the flow chart in FIG. 4 and FIGS. 5A and 5B.

Figure 4:
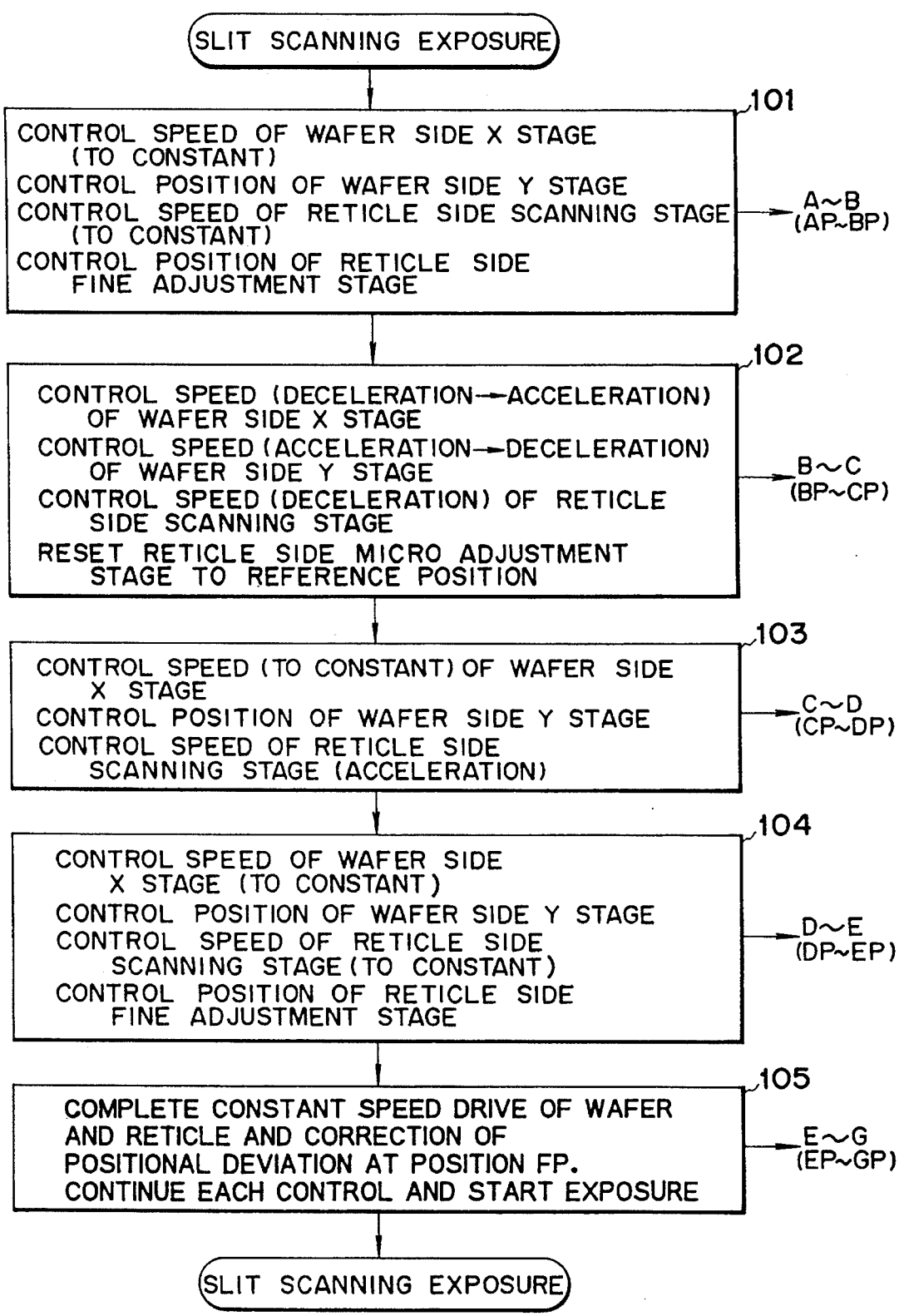
FIG. 4 is a flow chart showing a control method in a scanning exposure operation in the first embodiment.
Figure 5A:
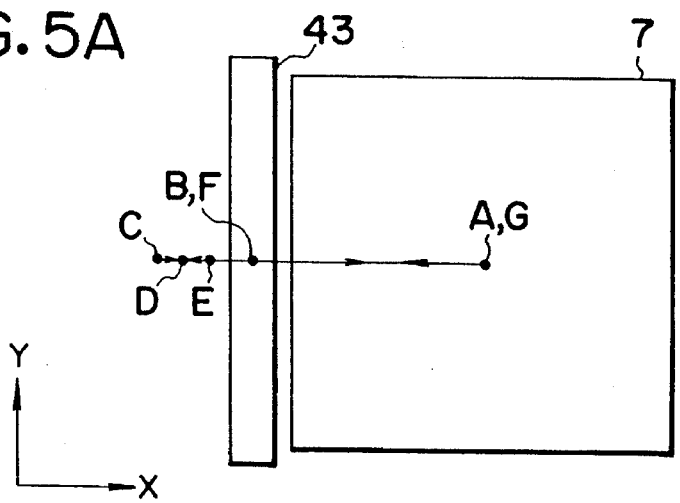
FIG. 5A is a plan view showing the relative positions of a reticle and an illumination area.

FIG. 5A shows the relative positional relationship between the reticle 7 and the slit-like illumination area 43. FIG. 5B shows the relative positional relationship between the wafer 14 and the slit-like exposure area 43 P. Assume that reduced pattern images of the reticle 7 are sequentially exposed on two adjacent shot areas 50A and 50B on the wafer 14. For the sake of descriptive convenience, assume that the center of the illumination area 43 in FIG. 5A is located at a central position A of the reticle 7, and the center of the exposure area 43 P in FIG. 5B is located at a central position AP of the first shot area 50A in an initial state. In this case, the relative position and rotational angle differences between the reticle 7 and the wafer 14 are 0. Furthermore, assume that the reticle 7 is scanned in the X direction at a speed $V/\beta$, and the wafer 14 is scanned in the $-X$ direction at a speed V in the initial state. The flow of processing shifts from this initial state to step 101 in FIG. 4.

In step 101 in FIG. 4, the main control system 23 in FIG. 1 drives the wafer side X stage 27 in the $-X$ direction at the speed V, and drives the reticle side scanning stage 20 in the X direction at the speed $V/\beta$. In order to drive the wafer side X stage 27 at a constant speed, the main control system 23 samples the differential value of the X-coordinate data WSx supplied from the laser interferometer 48 and issues the X-direction drive command ODWx to make the differential value constant so as to correspond to the speed V. Similarly, in order to drive the reticle side scanning stage 20 at a constant speed, the main control system 23 samples the differential value of the X-coordinate data RSx supplied from the laser interferometer 36A and issues the first drive command ODR1 to make the differential value constant so as to correspond to the speed $V/\beta$.

In addition, the main control system 23 performs positional control of the wafer side Y stage 28 and the reticle side fine adjustment stage 21. More specifically, the main control system 23 detects the X-coordinate data WSx associated with the wafer 14 and the X-coordinate data RSx associated with the reticle 7, and samples (WSx/β+RSx) on the basis of these data. Similarly, the main control system 23 samples (WSy/β+RSy) on the basis of the Y-coordinate data WSy associated with the wafer 14 and the Y-coordinate data WRy associated with the reticle 7; and (WSθ+RSθ) on the basis of the rotational angle data RSθ associated with the wafer 14 and the rotational angle data RSθ associated with the reticle 7.

Subsequently, the main control system 23 issues the Y-direction drive command ODWy and the second drive command ODR2 to the drives 31 and 25, respectively, to perform position control such that these three data become predetermined reference values, respectively. These three reference values are predetermined on the basis of the design coordinate values of the respective shots arranged on a wafer, and are stored in a storage unit in the main control system 23. When each shot is to be exposed, the positions of the wafer and the reticle are controlled on the basis of the three reference values corresponding to each shot and the three sampled data.

Figure 5B:
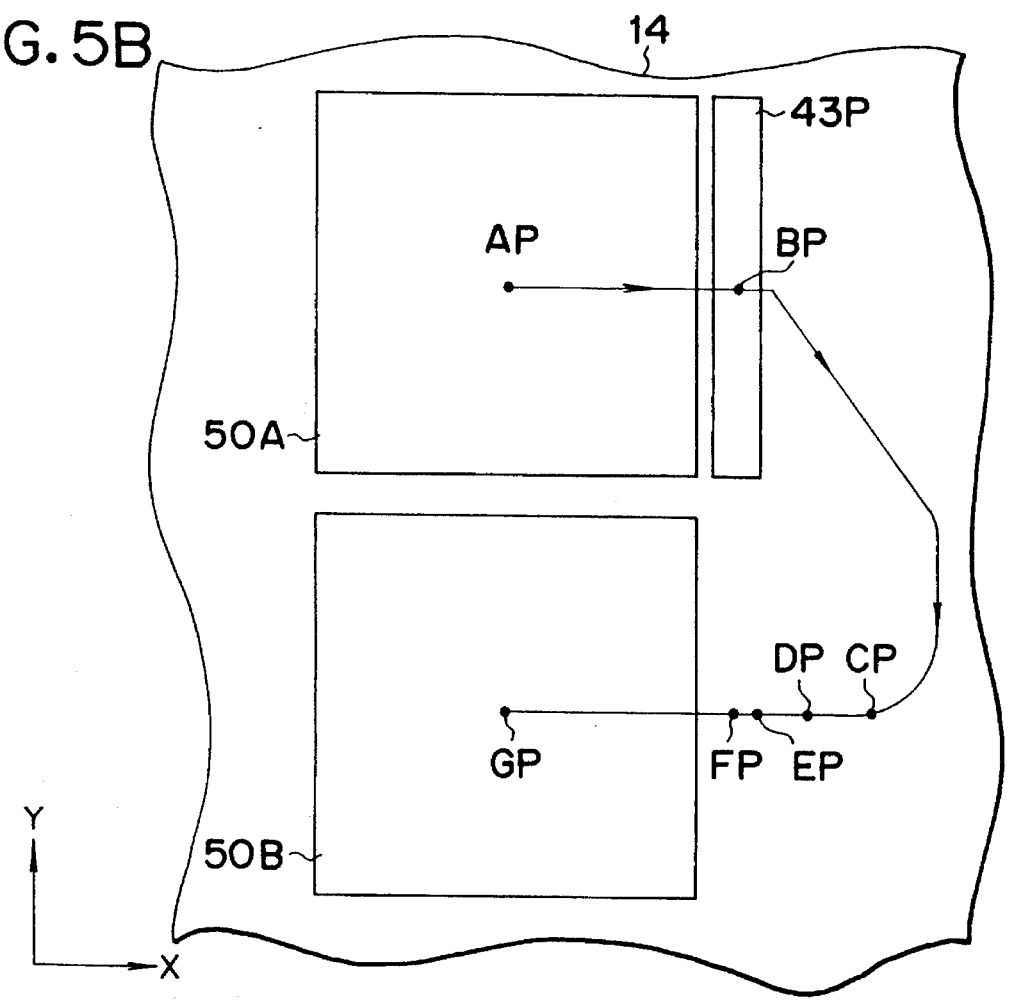
FIG. 5B is a plan view showing the relative positions of a wafer and an exposure area in correspondence with FIG. 5A.

With this operation, the center of the illumination area 43 shifts from the position A to the position B located outside the pattern area of the reticle 7 in FIG. 5A, and the center of the exposure area 43 P shifts from the position AP to the position BP located outside the first shot area 50A of the wafer 14 in FIG. 5B, thus completing the first slit scanning exposure operation.

In step 102, the main control system 23 drives the wafer side X stage 27 such that the stage 27 is decelerated temporarily and is accelerated in the X direction, and also drives the wafer side Y stage 28 such that the stage 28 is accelerated temporarily and is decelerated in the Y direction. Meanwhile, the main control system 23 decelerates the reticle side scanning stage 20 and resets the reticle side fine adjustment stage 21 to the initial position. With this operation, the center of the illumination area 43 shifts from position B to a position C located farther outside than the position B and stops thereat in FIG. 5A, and the center of the exposure area 43 P shifts from the position BP to a position CP located outside the second shot area 50B of the wafer 14 in FIG. 5B. At this position CP, the wafer side X stage 27 has already started constant speed scanning in the X direction.

In step 103, the main control system 23 drives the wafer side X stage 27 in the X direction at the speed V. In addition, since the position of the wafer side Y stage 28 is fluctuating owing to the acceleration and deceleration of the wafer side Y stage 28 in step 102, the main control system 23 stabilizes the position of the wafer side Y stage 28 through the stepping motor 29. Meanwhile, the main control system 23 accelerates the reticle side scanning stage 20 in the $-X$ direction. With this operation, the center of the illumination area 43 shifts from the position C to a position D closer to the reticle 7 in FIG. 5A, and the center of the exposure area 43 P shifts from the position CP to a position DP closer to the second shot area 50B in FIG. 5B. At the position D, the reticle side scanning stage 20 has already started to move in the X direction at the constant speed $V/\beta$. Therefore, the scanning speed of the reticle 7 relative to the wafer 14 has reached the design value.

In step 104, the main control system 23 drives the wafer side X stage 27 in the X direction at the speed V, and drives the reticle side scanning stage 20 in the $-X$ direction at the constant speed $V/\beta$. In addition, the main control system 23 performs positional control of the wafer side Y stage 28 and the reticle side fine adjustment stage 21. More specifically, similar to step 101, the main control system 23 samples (WSx/β+ RSx), (WSy/β+RSy), and (WSθ+RSθ) from the coordinate positions of the wafer 14 and the reticle 7. The main control system 23 then issues the Y-direction drive command ODWy and the second drive command ODR2 to the drives 31 and 25, respectively, and performs position control such that these three data become predetermined values, respectively.

In this manner, the positions of the reticle 7 and the wafer 14 are controlled. At this time, the center of the illumination area 43 is at a position E located outside the pattern area of the reticle 7, as shown in FIG. 5A, and the center of the exposure area 43 P is at a position EP located outside the second shot area 50B of the wafer 14, as shown in FIG. 5B.

In step 105, when constant speed drive of the reticle 7 and the wafer 14 and coordinate position correction thereof are completed, the center of the illumination area 43 is at a position F located immediately before the pattern area of the reticle 7, as shown in FIG. 5A, and the center of the exposure area 43 P is at a position FP immediately before the second shot area 50B of the wafer 14, as shown in FIG. 5B.

With the same control as that performed in step 101, the illumination area 43 relatively scans the reticle 7 up to its central position G, as shown in FIG. 5A, and the exposure area 43 P relatively scans the second shot area 50B of the wafer 14 up to its central position GP, as shown in FIG. 5B. Thereafter, by repeating the processing in step 101 and the subsequent steps, patterns of the reticle 7 are exposed on the second shot area 50B and the next shot area of the wafer 14.

As described above, according to the first embodiment, the stage system on the reticle 7 side is divided into the reticle side scanning stage 20 and the reticle side fine adjustment stage 21, and these stages can be independently driven. With this arrangement, while the reticle 7 and the wafer 14 are driven at constant speeds, respectively, the coordinate positions of the reticle 7 and the wafer 14 can be easily and quickly corrected. Therefore, a pattern image of the reticle 7 can be exposed on each shot area of the wafer 14 without distortion.

Provided that the weights of the reticle side scanning stage 20 and the reticle side fine adjustment stage 21 are respectively represented by M1 and M2, a relative scanning linear motor drives the stages 20 and 21 with a weight (M1+M2). In contrast to this, since the actuators 38, 40, and 42 shown in FIG. 2 drive the reticle side fine adjustment stage 21 with the weight M2, they exhibit excellent response characteristics in correction of the position deviation. Assume that when an acceleration a is applied to the reticle side fine adjustment stage 21 on the reticle side scanning stage 20, the acceleration, of the reticle side scanning stage 20, which acts on the reticle side scanning stage 20 (i.e., the reaction of the acceleration a) is represented by b. In this case, the following equation can be established:

$$M2 \cdot a = (M1 + M2)b \tag{1}$$

Therefore, the acceleration b is lower than the acceleration a, and positional control of the reticle side fine adjustment stage 21 hardly affects the constant speed scanning operation of the reticle side scanning stage 20, thus realizing stable speed control.

A projection exposure apparatus according to the second embodiment of the present invention will be described next with reference to FIGS. 6 to 16B. In this embodiment, the present invention is applied to a projection exposure apparatus of a stitching and slit scanning exposure scheme, which apparatus includes a pulse emission type laser source.

Figure 6:
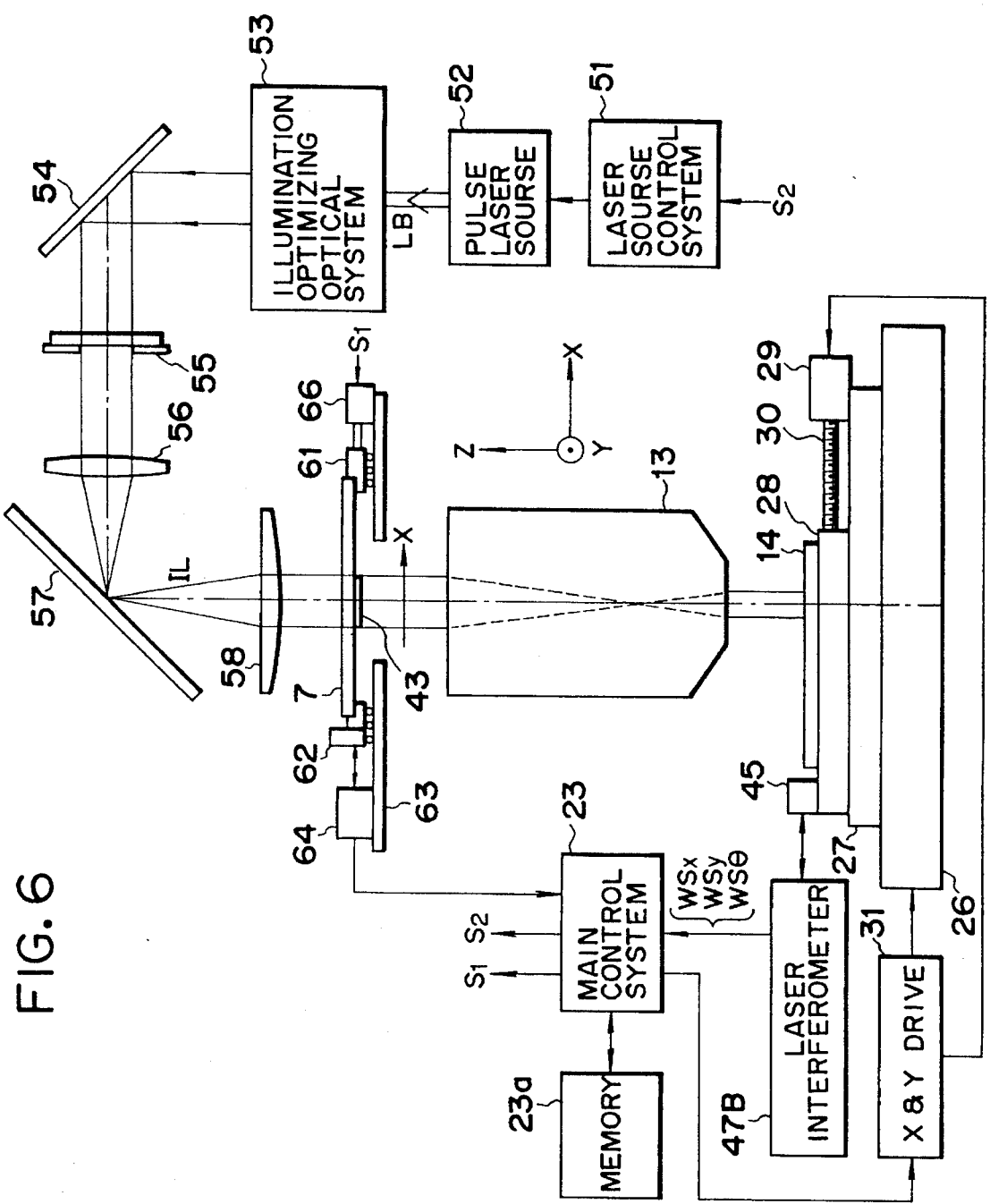
FIG. 6 is a view showing a projection exposure apparatus according to the second embodiment of the present invention.

FIG. 6 shows the overall arrangement of the projection exposure apparatus of the second embodiment. The second embodiment has almost the same arrangement as that of the first embodiment except for the illumination optical system 22 and the stage system for a reticle in the first embodiment. Therefore, the same reference numerals in FIG. 6 denote the parts having the same functions as in FIG. 1, and a description thereof will be omitted.

Referring to FIG. 6, a laser beam LB emitted from a pulse laser source 52 such as an excimer laser is incident on an illumination optimizing optical system 53 constituted by a beam expander, an optical integrator, and an aperture stop, a relay lens, and the like. A pulse laser beam IL as exposure light emerging from the illumination optimizing optical system 53 is reflected by a deflecting mirror 54 to be incident on a field stop 55. The pulse laser beam IL passing through the aperture of the field stop 55 illuminates a reticle 7 with uniform illuminance through a relay lens 56, a deflecting mirror 57, and a condenser lens 58. The plane where the field stop 55 is arranged is conjugate to the pattern formation surface of the reticle 7. The shape of a slit-like illumination area 43 on the pattern formation surface of the reticle 7 is set by the aperture of the field stop 55.

The reticle 7 is held on a reticle stage 61. Movable mirrors 62 are attached to the reticle stage 61 in the X direction (a lateral direction parallel to the drawing surface of FIG. 6) and the Y direction (a direction perpendicular to the drawing surface of FIG. 6), respectively. The reticle stage 61 and the movable mirrors 62 are held such that they can be moved along a guide 63 within the X—Y plane and can be moved in the X direction at a constant speed. A drive 66 is connected to the reticle stage 61 to move the stage 61 in the X and Y directions and perform fine rotation for yawing correction. Laser beams from a laser interferometer 64 fixed to the guide 63 are reflected by the movable mirrors 62 so that the X- and Y-direction positions of the reticle 7 and its yawing amount are constantly measured by the laser interferometer 64. The measurement data are supplied to a main control system 23. The main control system 23 supplies a control signal $S_1$ to the drive 66 to control the movement of the reticle 7, and also outputs a control signal $S_2$ to a laser source control system 51 to control the emission of the pulse laser source 52. The main control system 23 includes a storage unit 23a.

Figure 7A:
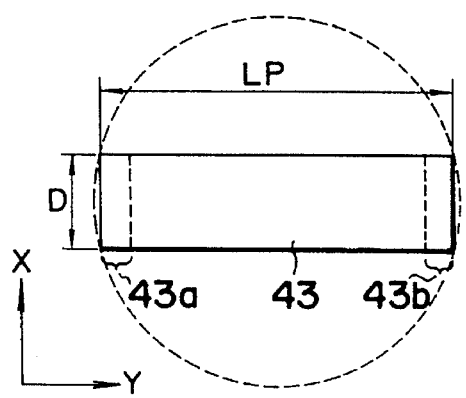
FIG. 7A is a plan view showing a slit-like illumination area on a reticle 19 in FIG. 6.
Figure 7B:
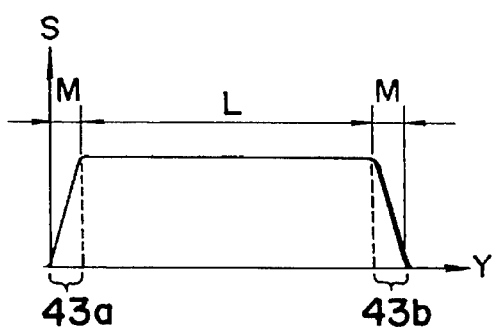
FIG. 7B is a graph showing the illuminance distribution of the illumination area.

FIG. 7A shows the slit-like rectangular illumination area 43 on the reticle 7. The illumination area 43 is inscribed in the contour of a circular area conjugate to the maximum exposure field of a projection optical system 13. The illumination area 43 has a length LP (=L+2M) in the Y direction and a width D in the X direction. When the reticle 7 is scanned in the X direction, a pulse laser beam within the illumination area 43 sequentially illuminates a pattern area wider than the illumination area 43 on the reticle 7. As shown in FIG. 7B, according to a light intensity distribution (to be referred to as an illuminance distribution hereinafter) S in the Y direction within the illumination area 43, the light intensity is constant in a central area having a length L, and decreases almost linearly to 0 in side areas 43a and 43b, each having a length M. That is, the illuminance distribution S of the illumination area 43 in the Y direction perpendicular to the relative scanning direction has a trapezoidal shape. In order to obtain such a trapezoidal illuminance distribution, the aperture of the field stop 55 in FIG. 6 may be set in a defocus state in the longitudinal direction. Alternatively, a trapezoidal illuminance distribution can be obtained by arranging an ND filter plate or the like, whose transmittance linearly changes, in the field stop 55 or the illumination optimizing optical system 53.

Figure 8:
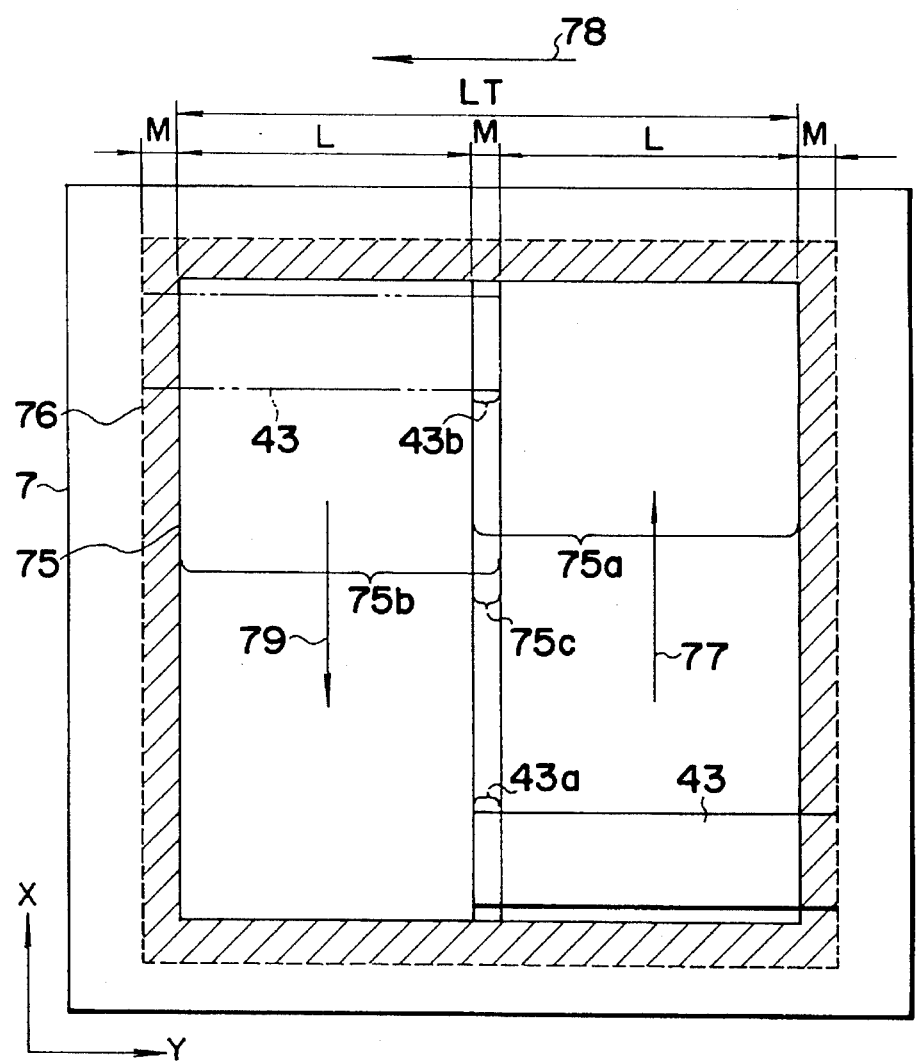
FIG. 8 is a plan view showing a reticle pattern in the second embodiment.

FIG. 8 shows the reticle 7 in FIG. 6. Referring to FIG. 8, a pattern area 75 having a width LT in the Y direction is formed on the pattern formation surface of the reticle 7. A circuit pattern to be transferred onto a wafer is formed in this pattern area 75. A forbidden zone 76, consisting of a light-shielding portion having a width M or more, is formed on outer peripheral portions of the pattern area 75 in the Y direction. In the second embodiment, the pattern area 75 is scanned twice in the X direction with the slit-like illumination area 43 to transfer a pattern of the pattern area 75 onto the wafer. For example, a pattern of a substantially right half area 75a is transferred onto the wafer by the first scanning operation, and a pattern of a substantially left half area 75b is transferred onto the wafer by the second scanning operation.

In this case, a left side portion of the area 75a and a right side portion of the area 75b are superposed on each other at a connection area 75c having the width M in the Y direction, and the connection portion 75c is scanned by the area 43a or 43b in which the light intensity (illuminance) of the illumination area 43 gradually decreases. With this operation, the illuminance distribution of the connection portion 75c is made uniform, and the position deviation of a transferred pattern can be prevented. In addition, in order to make the illuminance in the pattern area 75 constant, no area at an end portion of the pattern area 75 in the Y direction is scanned by the area 43a or 43b in which the illuminance of the illumination area 43 gradually decreases. Since the Y-direction width of the area, in the illumination area 43, in which the illuminance is constant is represented by L, and the Y-direction width of the pattern area 75 is represented by LT, the Y-direction width M of the area 43a or 43b in which the illuminance gradually decreases to 0 is given by:

$$M = LT - 2 \cdot L \quad (2)$$

In general, the pattern area 75 is scanned n times in the X direction by the illumination area 43 to transfer a pattern of the pattern area 75 onto a wafer 14. In order to prevent the formation of an area which is illuminated only with the area 43a or 43b in which the illuminance gradually decreases, the width M of the area 43a or 43b in which the illuminance gradually decreases may be set as follows:

$$M = (n \cdot LP - LT)/(n+1) \quad (3)$$

Figure 9A:
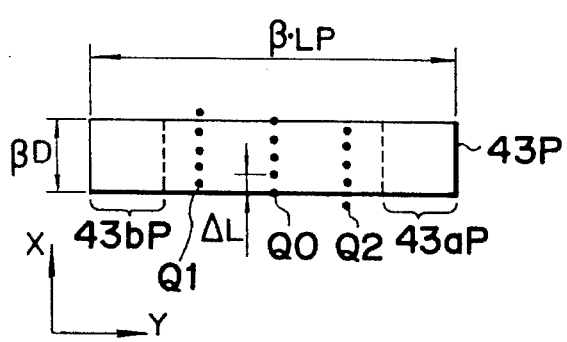
FIG. 9A is a plan view showing a slit-like exposure area on a wafer in the second embodiment.
Figure 9B:
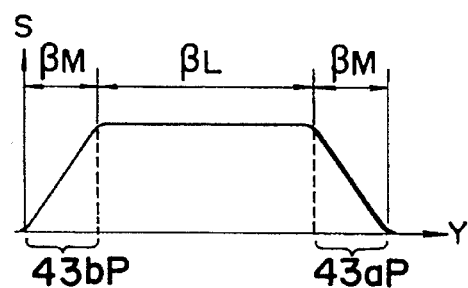
FIG. 9B is a graph showing the illuminance distribution of the exposure area.

FIG. 9A shows a slit-like rectangular exposure area 43 P on the wafer 14 in FIG. 6. The exposure area 43 P is conjugate to the illumination area 43 on the reticle 7 in FIG. 7A. In this case, since the projecting magnification of the projection optical system 13 is β, the X- and Y-direction widths of the exposure area 43 P are β·D and β·LP, respectively. In addition, as shown in FIG. 9B, in areas 43 aP and 43 bP, of the exposure area 43 P, located at two ends and having a width β·M in the Y direction, illuminance S decreases almost linearly to 0. The illuminance distribution of the exposure area 43 P in the Y direction perpendicular to the relative scanning direction has a trapezoidal shape.

The condition for the width β·D of the exposure area 43 P in the X direction as the relative scanning direction will be described next. In this case, provided that the pulse emission period (i.e., the reciprocal of an emission frequency f) of the pulse laser source 52 in FIG. 6 is T, and the distance by which the wafer 14 is scanned in the X direction in one period T during an slit scanning exposure operation is ΔL, the X-direction width Δ·D of the exposure area 43 P is set to be an integer multiple of the distance ΔL. In addition, if the scanning speed of the wafer 14 in the X direction is represented by V, then the distance ΔL is T·V. That is, the following equation can be established, providing that m is an integer of one or more:

$$\beta \cdot D = m \cdot \Delta L = m \cdot T \cdot V \quad (4)$$

FIG. 9A shows a case where β·D=4·ΔL. In this case, for example, an exposure point Q0 which is present at an edge portion of the exposure area 43 P when pulse emission occurs is irradiated with a pulse laser beam corresponding to three pulses within the exposure area 43 P, and is irradiated with a pulse laser beam corresponding to two pulses at the edge portion of the exposure area 43 P. Letting ΔE be the energy radiated on an exposure point inside the exposure area 43 P by one pulse emitting operation, energy represented by 4·ΔE (=ΔE/2+3·ΔE+ΔE/2) is radiated on the exposure point Q0. In addition, as shown in FIG. 9A, energy represented by 4·ΔE is radiated on an exposure point Q1, on the wafer, which is present inside the edge portion of the exposure area 43 P when pulse emission occurs, and energy represented by 4·ΔE is radiated on an exposure point Q2, on the wafer, which is present outside the edge portion of the exposure area 43 P when the pulse emission occurs. As described above, according to the second embodiment, the same pulse laser beam corresponding to m pulses is radiated on all the exposure points, on the wafer, which are scanned by the exposure area 43 P. Therefore, a constant illuminance distribution is set at the exposure points which are scanned by the area, of the exposure area 43 P, in which the illuminance is constant.

Although energy corresponding to m pulses is radiated on exposure points which are scanned once by the two side areas 43 aP and 43 bP of the exposure area 43 P, the radiated energy is lower than that radiated on the other exposure points. However, as described above, in the second embodiment, since a connection portion is scanned twice by the areas 43 aP and 43 bP in a stitching operation, energy represented by m·ΔE is also radiated on each exposure point of the connection portion. Therefore, the same amount of energy is radiated on all the exposure points on the wafer, preventing illuminance irregularity.

An example of stitching and slit scanning exposure in the second embodiment will be described next. Referring to FIG. 6, while the slit-like illumination area 43 on the reticle 7 is illuminated with the pulse laser beam IL, the main control system 23 scans the reticle 7 in the −X direction at the constant speed V/β through the drive 66 and the reticle stage 61. In synchronism with this scanning operation, the main control system 23 scans the wafer 14 in the X direction at the constant speed V through a drive 31. In this case, the main control system 23 obtains the coordinate position (RSx,RSy) of the reticle 7 and the coordinate position (WSx,WSy) of the wafer 14 at the time when, for example, a predetermined alignment mark on the reticle 7 coincides with a predetermined alignment mark on the wafer 14, on the basis of measurement values obtained by a laser interferometer 64 and a laser interferometer 47. Similar to the first embodiment, the main control system 23 then calculates (SWx/β+ RSx), (WSy/β+RSy), and (WSθ+RSθ), and stores these values as reference values in the storage unit 23a in advance. In addition, the main control system 23 obtains these three reference value for each shot exposed on the wafer in advance, and stores them in the storage unit 23a. The main control system 23 controls the coordinate positions of the wafer 14 and the reticle 7 through the drives 66 and 31 such that the three data (WSx/β+RSx), (WSy/β+ RSy), and (WSθ+ RSθ) sampled during a relative scanning operation with respect to the wafer 14 and the reticle 7 coincide with the above-mentioned reference values.

With this operation, as shown in FIG. 8, on the reticle 7 side, the slit-like illumination area 43 relatively scans the right area 75a of the pattern area 75 along a trace 77. In addition, as shown in FIG. 10A, on the wafer side 28, the slit-like exposure area 43 P relatively scans a left area 80a of an exposure area 80 along a trace 77 P.

When the first slit scanning exposure operation is completed, the reticle 7 is moved in the Y direction by stitching so as to move the illumination area 43 to an upper left position in the pattern area 75 along a trace 78, as shown in FIG. 8. Referring to FIG. 10A, a slit-like exposure area 20 P is moved to a lower right position in the exposure area 80 along a trace 78 P by moving the wafer 14 in the −Y direction. Thereafter, the reticle 7 is scanned at the speed V/β in the X direction, and the wafer 14 is scanned at the speed V in the −X direction, thereby performing the second slit scanning exposure operation. As a result, as shown in FIG. 8, on the reticle 7 side, the slit-like illumination area 43 relatively scans the left area 75b of the pattern area 75 along a trace 79. In addition, as shown in FIG. 10A, on the wafer 14 side, the slit-like exposure area 43 P relatively scans the right area 80b of the exposure area 80 along a trace 79 P.

As shown in FIG. 8, at the connection portion 75c of the pattern area 75 of the reticle 7, exposure is performed twice by the left and right areas 43a and 43b, of the illumination area 43, in which the illuminance decreases, with the first and second scanning operations. Therefore, the main control system 23 controls the position of the reticle 7 such that the moving amount of the reticle 7 in the Y direction in a stitching operation becomes (LP–M). Similarly, the main control system 23 controls the position of the wafer 14 such that the moving amount of the wafer 14 in the −Y direction in a stitching operation becomes (LP–M)/β.

Figure 10A:
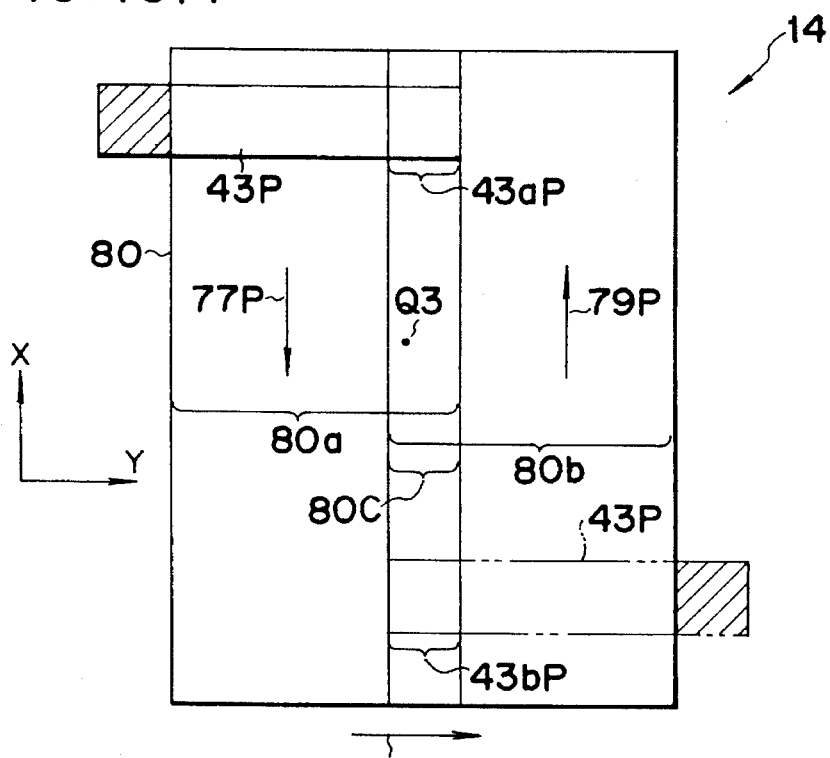
FIG. 10A is a plan view showing an exposure area on a wafer.
Figure 10B:
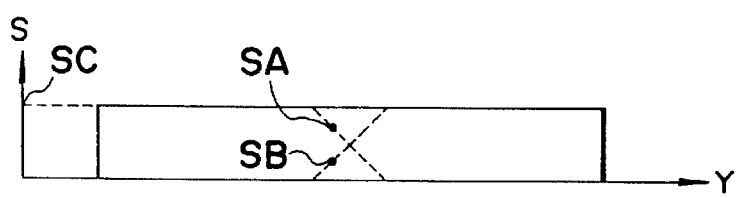
FIG. 10B is a graph showing the illuminance distribution of the exposure area.

With this control, as shown in FIG. 10A, at a connection portion 80c, of the exposure area 80 of the wafer 14, located at a middle position in the Y direction, exposure is performed twice by the right and left areas 43 ap and 43 bp, of the slit-like exposure area 43 P, in which the illuminance decreases. For example, at an exposure point Q3 inside the connection portion 80c, the illuminance in the first exposure operation becomes an illuminance SA in FIG. 10B; and the illuminance in the second exposure operation, an illuminance SB. As shown in FIG. 9B, since the illuminances of the areas 43 aP and 43 bP in the Y direction symmetrically and linearly decrease to 0, the sum of the illuminances SA and SB in FIG. 10B becomes equal to an illuminance SC obtained when exposure is performed by using the area, of the exposure area 43 P, in which the illuminance is constant.

As has been described above, all the exposure points which are scanned by the exposure area 43 P once are irradiated with a pulse laser corresponding to m pulses. The exposure point Q3 inside the connection portion 80c is irradiated with the same amount of energy as that radiated on an exposure point which is scanned once by two scanning operations of the exposure area 43 P (i.e., an exposure point outside the connection portion). Therefore, the illuminances at all the exposure points on the wafer 14 are made uniform. In addition, at an exposure point inside the connection portion 80c, the number of pulses radiated in two scanning operations is 2 m, which is twice that radiated at an exposure point outside the connection portion. Therefore, at the connection portion 80c, especially variations in the energy of a pulse laser beam for each pulse and the influences of speckles are reduced. More specifically, at the connection portion 80c, the variations in illuminance due to variations in the energy of a pulse laser beam for each pulse are reduced to $½^{1/2}$ the variations at a non-connection portion.

In the second embodiment, when slit scanning exposure is to be performed with respect to the area 80a on the wafer 14 shown in FIG. 10A, the main control system 23 stores the differences between the above-mentioned three data (WSx/β+RSx), (WSy/β+ RSy), and (WSθ+RSθ) and the corresponding reference values in the storage unit 23a. When a pulse laser beam corresponding to m pulses is radiated on an arbitrary exposure point on the wafer 14 by the first scanning operation, the main control system 23 monitors each difference in synchronism with each pulse emitting operation. These differences cause intra-shot distortion at the connection portion 80c on the wafer 14. Therefore, when exposure is to be performed with respect to the area 80b on the wafer 14 by the second scanning operation, the main control system 23 controls the coordinate positions of the reticle 7 and the wafer 14 through the drives 66 and 31 such that the monitored differences coincide with the readout differences. With this operation, the pattern overlapping precision at the connection portion 80c on the wafer 14 is greatly improved.

In general, if the positioning precisions of the reticle stage 61 and wafer stages (27 and 28) in the X and Y directions are respectively represented by Δx and Δy, overlapping errors at the connection portion 80c are respectively represented by $2^{1/2}Δx$ and $2^{1/2}Δy$. In contrast to this, according to the method of the second embodiment, the overlapping errors are only Δx and Δy because the positions of the reticle 7 and the wafer 14 in exposing the area 80b by the second scanning operation are controlled in accordance with shot distortion caused in exposing the area 80a by the first scanning operation.

Figure 11:
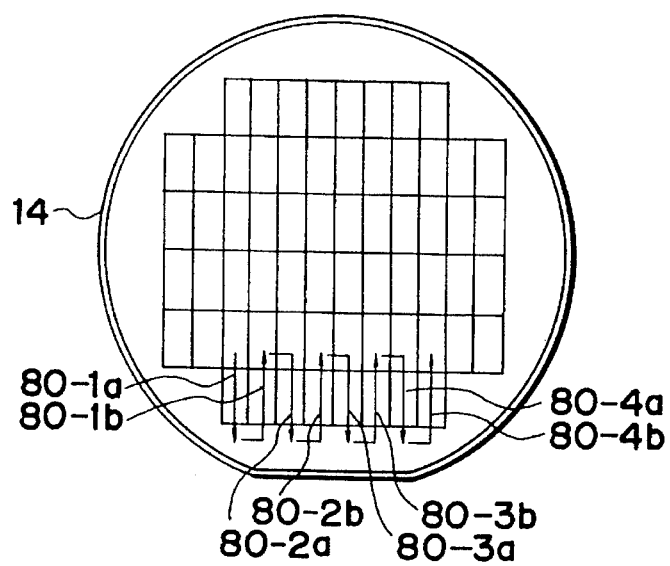
FIG. 11 is a plan view showing a trace of scanning exposure on a wafer in the second embodiment.

A method of exposing the entire exposure surface of the wafer 14 will be described next. Consider a case where the stitching and slit scanning exposure operation described in the second embodiment is applied to this exposure method. As shown in FIG. 11, exposure is sequentially performed with respect to adjacent areas 80-1a, 80-1b, 80-2a, 80-2b, . . . , 80-4a, and 80-4b by the slit scanning exposure method. According to this scanning method, a pattern of the pattern area 75 can be transferred onto the wafer 14 in a short period of time, and hence the transfer operation is not easily influenced by the expansion of the wafer 14 and the like. In contrast to this, the precision at the connection portion may deteriorate depending on the characteristics in the scanning direction. For this reason, the reticle 7 must be moved, along the trace 78, in the Y direction with respect to the illumination area 43 in FIG. 8, at a high speed.

Figure 12A:
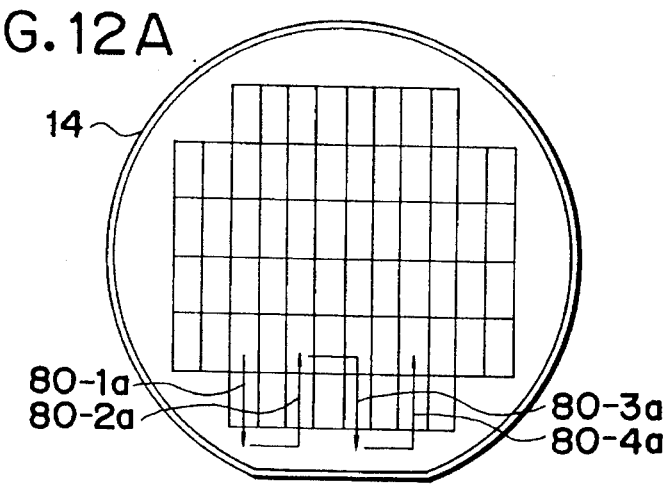
FIGS. 12A and 12B are plan views other traces of scanning exposure on the wafer in the second embodiment.
Figure 12B:
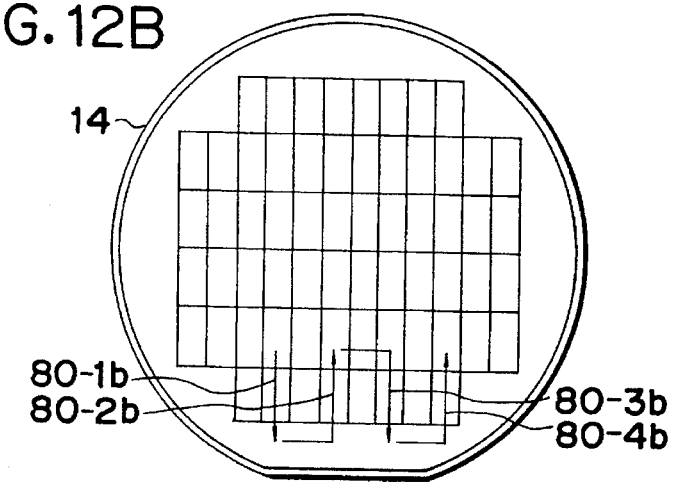

According to another exposure method, as shown in FIGS. 12A and 12B, for example, only the right half area 75a of the pattern area 75 of the reticle 7 is continuously exposed on a corresponding area on the wafer 14. Thereafter, only the left half area 75b of the pattern area 75 is continuously exposed on a corresponding area on the wafer 14. In this method, as shown in FIG. 12A, exposure is performed first with respect to the areas 80-1a, 80-2a, . . . , 80-4a on the wafer 14. Thereafter, as shown in FIG. 12B, exposure is performed with respect to the areas 80-1b, 80-2b, . . . , 80-4b on the wafer 14 along a trace parallel to the trace in FIG. 12A. Therefore, the main control system 23 controls the position of the wafer 14 such that the moving amount of the wafer 14 corresponding to the trace 78 P of the exposure area 43 P in the −Y direction in FIG. 10A becomes 2(LP–M)/β. According to this method, in two exposure areas (e.g., the areas 80-1a and 80-1b), on the wafer 14, corresponding to the pattern area 75 of the reticle 7, the slit-like exposure area 43 P is scanned in the same relative scanning direction. With this operation, the overlapping precision at the connection portion 80c is improved.

Figure 13A:
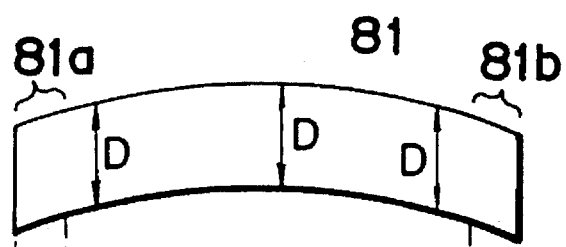
FIG. 13A is a plan view showing a modification of the illumination area on a reticle.

In the first and second embodiments, since a refracting optical system is used as the projection optical system 13, a rectangular illumination area is set on the reticle 7, as shown in FIGS. 5A and 7A. In contrast to this, the use of a projection optical system constituted by a reflecting/refracting optical system using a concave mirror and the like will provide advantageous effects in terms of aberrations and the like, especially as the wavelength of exposure light decreases. If this reflecting/refracting optical system is used, since the aberrations of a concave mirror or the like are reduced as the distance from the optical axis increases, the slit-like illumination area on the reticle 7 becomes an arcuated illumination area 81, as shown in FIG. 13A.

Figure 13B:
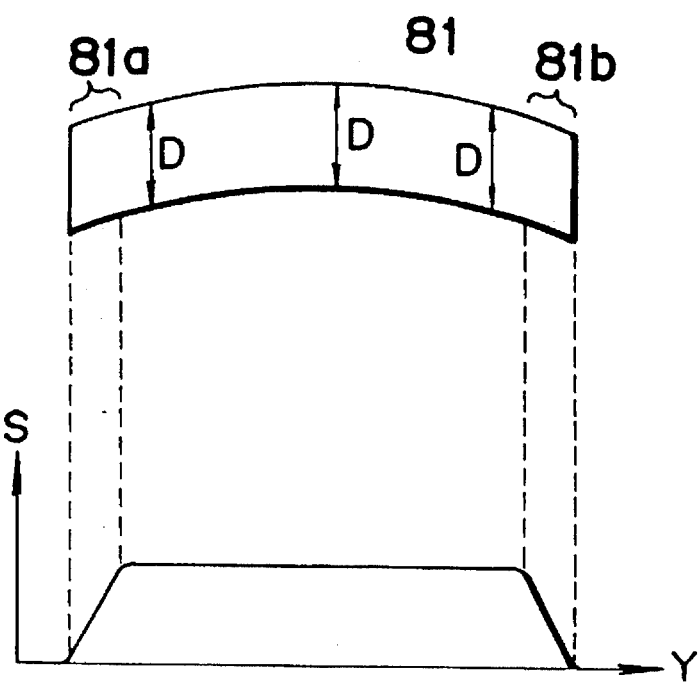
FIG. 13B is a graph showing the illuminance distribution of the modification of the illumination area.
Figure 14A:
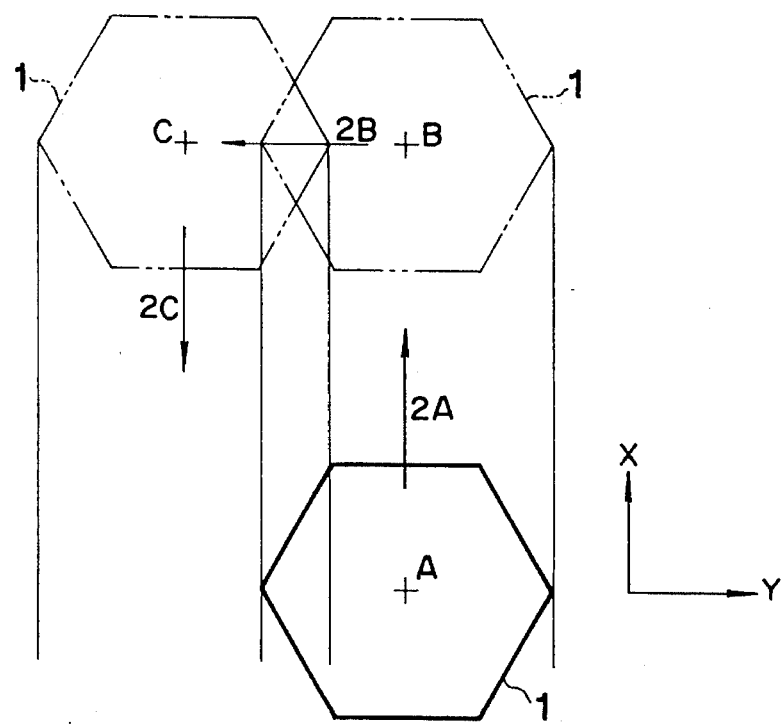
FIG. 14A is a plan view showing a state in which relative scanning is performed with respect to a regular hexagonal illumination area and a reticle.
Figure 14B:
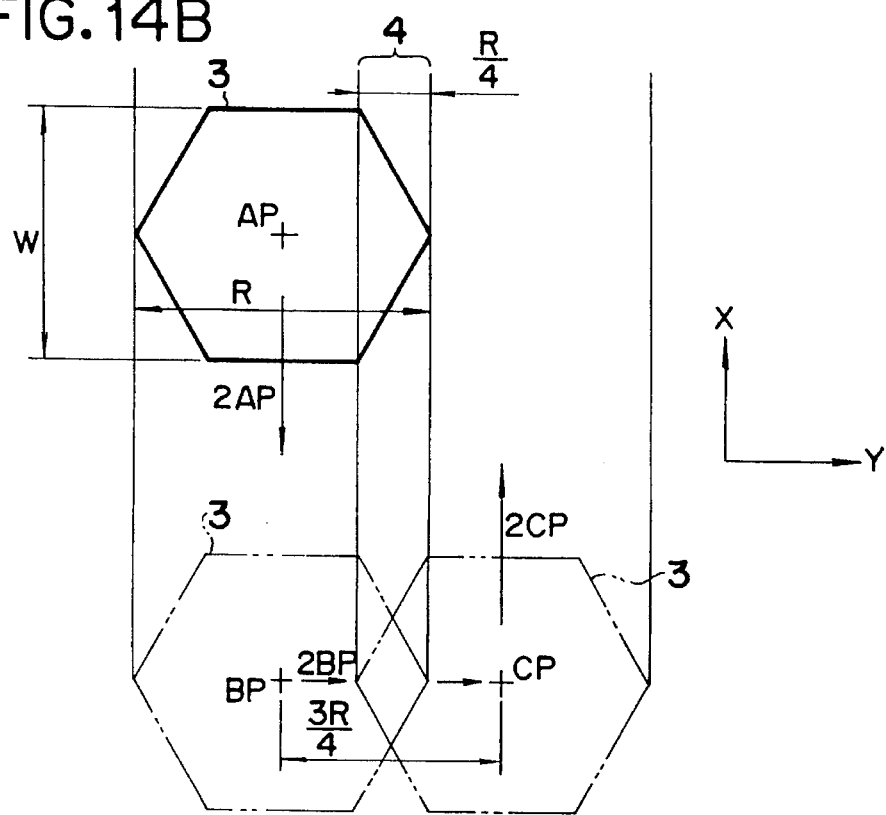
FIG. 14B is a plan view showing a state in which relative scanning is performed with respect to an exposure area on a wafer corresponding to FIG. 14A.
Figure 15A:
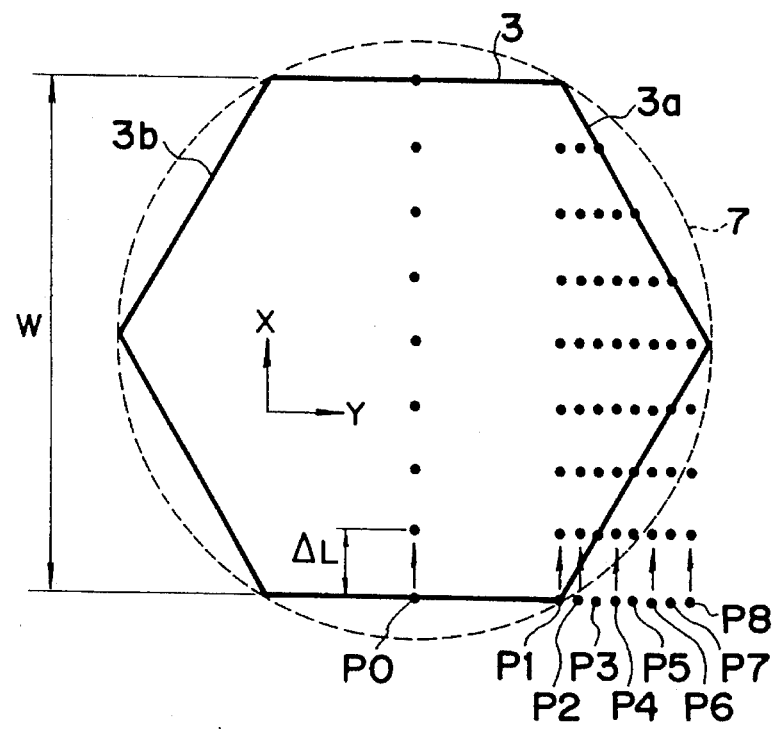
FIGS. 15A, 15B, and 15C are views for explaining illuminance irregularity on a photosensitive substrate when a pulse emission type light source is used to perform stitching and scanning exposure with respect to a regular hexagonal exposure area.
Figure 15B:
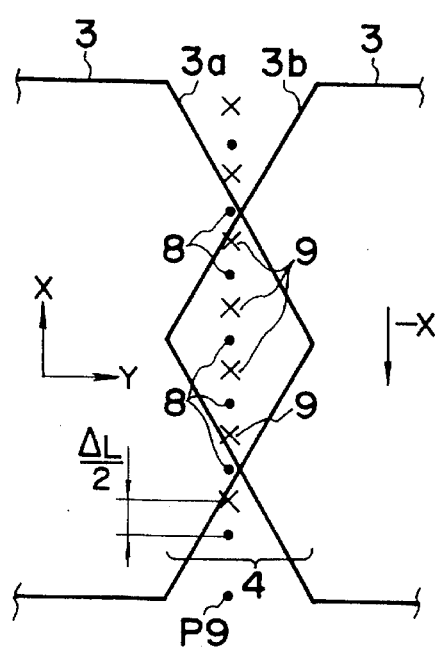
Figure 15C:
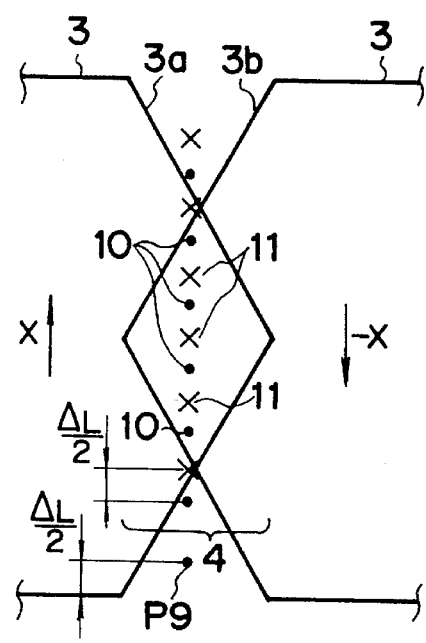

Assume that a width D of the illumination area 81 in the relative scanning direction is constant, and that the longitudinal direction, of the illumination area 81, which is perpendicular to the relative scanning direction is defined as the Y direction. In this case, the Y-direction illuminance distribution of the illumination area 81 is set to be trapezoidal, as shown in FIG. 13B. That is, in two side areas 81a and 81b of the illumination area 81 in the Y direction, the illuminances linearly decrease to 0. By setting such an illuminance distribution, the illuminance irregularity at the connection portion in a stitching operation can be reduced, similar to the second embodiment described above.

Consider a case where a regular hexagonal illumination area is set, as a modification of the second embodiment described above. The arrangement of this modification is the same as that of the second embodiment except for the shape of an illumination area.

Figure 16A:
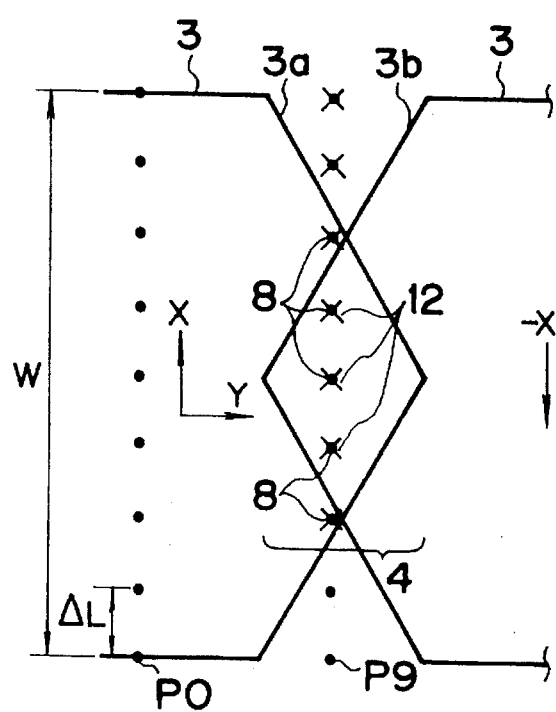
FIG. 16A is a plan view showing a positional relationship associated with pulse emission in a modification of the second embodiment of the present invention.

In the modification, in the first and second wafer scanning operations, the wafer is set at the same X-direction position when a pulse laser source performs pulse emission. More specifically, as shown in FIG. 16A, the X-direction positions of an exposure point P9 which are set when pulse emission is performed in the first wafer scanning operation are defined as positions 8, and the X-direction positions of an exposure point P9 which are set when pulse emission is performed in the second wafer scanning operation are defined as positions 12. In this case, a main control system 23 controls the timing of pulse emission through a laser source control system 51 to make the positions 12 and 8 coincide with each other. As shown in FIG. 16A, there are five positions 8 inside an area 3a, and three positions 12 inside an area 3b. Therefore, with the two slit scanning exposure operations, energy corresponding to a total of eight pulses is radiated on the exposure point P9.

Figure 16B:
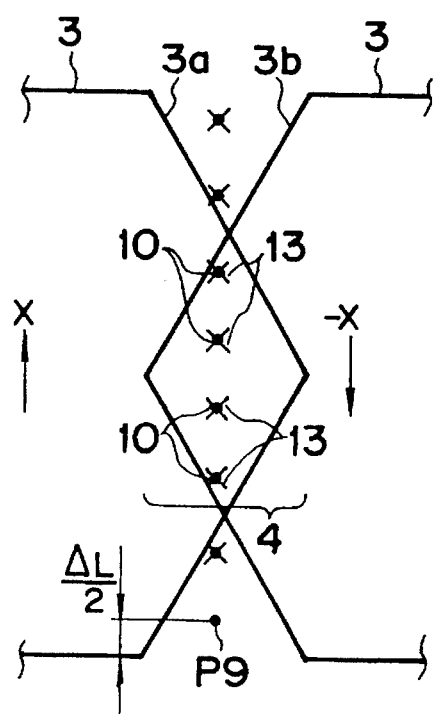
FIG. 16B is a plan view showing another positional relationship associated with pulse emission.

FIG. 16B shows a case where the pulse emission timings in the first and second scanning operations are shifted from those in the case shown in FIG. 16A in the X direction by ΔL/2. Referring to FIG. 16B, assume that the X-direction positions of an exposure point P9 which are set when pulse emission is performed in the first wafer scanning operation are defined as positions 10, and the X-direction positions of the exposure point P9 which are set when pulse emission is performed in the second wafer scanning operation are defined as positions 13. In this case, the wafer is also set at the same X-direction position when the pulse laser source performs pulse emission in the first and second wafer scanning operations. Since there are four positions 10 in an area 3a, and four positions 13 in an area 3b, energy corresponding to eight pulses is radiated on the exposure point P9 by the two slit scanning exposure operations. In general, according to this modification, energy corresponding to eight pulses is radiated on each exposure point in a connection portion 4 as well as an exposure point P0 in a non-connection portion, thereby preventing illuminance irregularity.

Furthermore, in the modification, the pulse emission timing is controlled such that a wafer is set at the same X direction position when the pulse laser source performs pulse emission in the first and second scanning operations. However, a wafer side. X stage 27 may be controlled.

In the second embodiment and its modification, a stitching operation using one reticle has been described. However, a plurality of reticles may be placed on the same reticle stage, and scanning exposure may be repeatedly performed while the reticles are interchanged with each other in a stitching operation. In addition, the reticle stage in the second embodiment and its modification may be constituted by a reticle side scanning stage and a reticle side fine adjustment stage, as in the case of the reticle stage system in the first embodiment.

The present invention is not limited to the first and second embodiments described above, and various changes and modifications can be made without departing from the scope and spirit of the invention.

What is claimed is:

1. An exposure apparatus for radiating exposure light on a predetermined illumination area on a mask on which a pattern to be transferred is formed, and exposing the pattern on a photosensitive substrate, comprising:

a scanning system for synchronously scanning the mask and the photosensitive substrate in a predetermined first direction of the illumination area while maintaining a predetermined speed ratio; and an illumination condition setting portion for setting the illumination area to be rectangular, and letting a light intensity distribution of the illumination area in a second direction substantially perpendicular to the first direction have a trapezoidal shape so that a middle portion of the distribution exhibits a substantially constant light intensity, and two side portions of the distribution exhibit a gradually decreasing light intensity.

2. An apparatus according to claim 1, wherein said scanning system scans the mask and the photosensitive substrate at least twice in the first direction, and further comprising a substrate moving system for moving the photosensitive substrate in the second direction while first and second scanning operations with respect to the mask and the photosensitive substrate are performed by said scanning system.

3. An apparatus according to claim 2, further comprising a mask moving system for moving the mask in the second direction while first and second scanning operations with respect to the mask and the photosensitive substrate are performed by said scanning system.

4. An apparatus according to claim 2, further comprising:

storage portion for storing a relative positional difference between the mask and the photosensitive substrate when the mask and the photosensitive substrate are to be synchronously scanned in the first direction; and a controller for controlling a position of at least of one of the mask and the photosensitive substrate such that the relative positional difference in the first scanning operation with respect to the mask and the photosensitive substrate coincides with that in the second scanning operation.

5. An apparatus according to claim 2 wherein said illumination condition setting portion determines a length M of each of the side portions, of the illumination area, in which the light intensity gradually decreases, in the second direction so as to establish $$M = (n \cdot LP - LT)/(n+1)$$

where n is an integer of not less than one, LP is a length of an illumination area on the mask in the second direction, and LT is a width of a pattern area, formed on the mask, in the second direction.

6. An apparatus according to claim 5, further comprising a projection optical system for projecting an image of a pattern of the mask, irradiated with the exposure light, onto the photosensitive substrate at a projecting magnification β, and wherein a moving amount of the photosensitive substrate moved by said substrate moving system in the second direction is defined as $$n \cdot (LP-M)/\beta$$

7. A projection exposure apparatus comprising:

a pulse light source for pulse-emitting exposure light;

an illumination optical system for illuminating a predetermined illumination area on a mask, on which a pattern to be transferred is formed, with the exposure light;

a projection optical system for projecting an image of the pattern, irradiated with the exposure light, onto a photosensitive substrate;

a scanning system for synchronously scanning the mask and the photosensitive substrate at least twice in a predetermined first direction of the illumination area while maintaining a predetermined speed ratio;

a substrate moving system for moving the photosensitive substrate in a second direction substantially perpendicular to the first direction while first and second scanning operations with respect to the mask and the photosensitive substrate are performed by said scanning system; and a controller for controlling at least one of said pulse light source and said scanning system such that a position of the photosensitive substrate in the first direction at the time when said pulse light source performs pulse emission, in the first scanning operation with respect to the photosensitive substrate and the mask coincides with that in the second scanning operation.

8. An apparatus according to claim 7, wherein said controller includes a position storage portion for detecting a position of the photosensitive substrate in the first direction when said pulse light source performs pulse emission, and storing data indicating the position, and controls one of said pulse light source and said synchronous scanning means on the basis of the stored data indicating the position of the photosensitive substrate.

9. A scanning exposure apparatus comprising:

a scanning system for synchronously scanning a mask and a photosensitive substrate for scanning exposure; and an adjusting system for moving the mask to decrease a positional deviation between the mask and the substrate, independently of scanning of the mask which is performed by said scanning system, during the scanning exposure.

10. An apparatus according to claim 9, further comprising:

a projection optical system for projecting a pattern image of the mask onto the substrate; and wherein said scanning system includes a mask stage for scanning the mask in a direction perpendicular to an optical axis of said projection optical system and a substrate stage for scanning the substrate in the direction perpendicular to the optical axis, and causes the mask stage and the substrate stage to scan at a speed ratio corresponding to a projecting magnification of said projection optical system.

11. An apparatus according to claim 10, wherein said adjusting system includes a finely movable stage for relatively moving the mask on said mask stage and a driving member for finely driving said finely movable stage in the direction perpendicular to said optical axis.

12. An apparatus according to claim 11, further comprising:

a first measuring system for measuring a position of the mask within a plane perpendicular to said optical axis; and a second measuring system for measuring a position of the substrate within a plane perpendicular to said optical axis, and wherein said adjusting system includes a controller for controlling the driving member in accordance with signals from said first and second measuring systems.

13. An apparatus according to claim 12, wherein said first measuring system includes a rotational angle detecting device for detecting a rotational angle of the mask within the plane perpendicular to said optical axis.

14. An apparatus according to claim 13, wherein said finely movable stage includes a mirror having a reflecting surface substantially perpendicular to said plane, and said first measuring system includes an interferometer for radiating a light beam onto said reflecting surface and receiving the light beam reflected by said reflecting surface.

15. A scanning exposure apparatus for projecting a pattern image of a mask onto a sensitive plate through a projection optical system in a scanning manner, the exposure apparatus comprising:

(a) a plate stage for scanning the plate in at least one-dimensional direction under said projection optical system for the scanning exposure;

(b) a first mask stage for scanning the mask in at least said one-dimensional direction above said projection optical system for the scanning exposure;

(c) a second mask stage for finely moving the mask on said first mask stage in each of translational and rotational directions;

(d) a first driving system for synchronously driving said plate stage and said first mask stage with a predetermined velocity ratio for the scanning exposure;

(e) a detecting system for detecting a positional deviation amount between the mask and the plate in a real time manner during the scanning exposure; and (f) a second driving system for driving said second mask stage to decrease the detected deviation amount during the scanning exposure.

16. The scanning exposure apparatus according to claim 15, wherein said detecting system includes a first measuring unit to detect a relative translational deviation amount between the mask and the plate and a second measuring unit to detect a relative rotational deviation amount between the mask and the plate.

17. The scanning exposure apparatus according to claim 16, wherein said second drive system includes a first actuator unit for finely moving said second mask stage in said one-dimensional scanning direction and in a cross direction of said scanning direction based on said translational deviation amount.

18. The scanning exposure apparatus according to claim 16, wherein said second drive system includes a second actuator unit for finely rotating said second mask stage about a predetermined point on the mask based on said rotational deviation amount.

19. The scanning exposure apparatus according to claim 18, wherein said predetermined point on the mask is changed in said one-dimensional scanning direction according to the scanning position of the mask.

20. The scanning exposure apparatus according to claim 16, wherein said first and second measuring units include a mask side interferometer system for measuring a coordinate position and a rotational angle of the mask and a plate side interferometer system for measuring a coordinate position and a rotational angle of the plate.

21. The scanning exposure apparatus according to claim 15, wherein each of said plate stage and said first mask stage is linearly movable in said one-dimensional scanning direction by restraining of respective linear air-guide structures.

22. The scanning exposure apparatus according to claim 21, wherein said first driving system includes a mask side linear motor for driving said first mask stage guided by the corresponding linear air-guide structure and a plate side linear motor for driving said plate stage guided by the corresponding linear air-guide structure.

23. A scanning exposure apparatus for projecting a pattern image of a mask onto a sensitive plate through a projection optical system in a scanning manner, the exposure apparatus comprising:

(a) a plate stage for moving the plate in at least one-dimensional direction under said projection optical system which has an imaging reduction ratio $1/\beta$;

(b) a first mask stage for moving the mask in at least said one-dimensional direction above said projection optical system;

(c) a second mask stage for finely moving the mask on said first mask stage in each of translational and rotational directions;

(d) an illuminating system for irradiating the mask with a radiation having a slit shaped distribution elongated perpendicular to said one-dimensional direction on the mask in order to project a slit shaped partial pattern image of the mask onto the plate through said projection optical system;

(e) a first driving system for synchronously, relatively driving said plate stage and first mask stage with a velocity ratio B for the scanning exposure of the plate by said slit shaped partial pattern image of the mask;

(f) a detecting system for detecting a deviation amount from an ideal positional relation of the mask and the plate occurring at a term of the scanning exposure; and (g) a second driving system for driving said second mask stage to correct the deviation during the scanning exposure when said detected deviation amount is out of a predetermined tolerance.

24. The scanning exposure apparatus according to claim 23, wherein said detecting system includes a first measuring system to detect a translational deviation amount from said ideal positional relation of the mask and the plate and a second measuring system to detect a rotational deviation amount from said ideal positional relation of the mask and the plate.

25. The scanning exposure apparatus according to claim 24, wherein said second drive system includes a first actuator system for finely moving said second mask stage in said one-dimensional scanning direction and a cross direction thereof based on said translational deviation amount.

26. The scanning exposure apparatus according to claim 24, wherein said second drive system includes a second actuator system for finely rotating said second mask stage about a predetermined point on the mask based on said rotational deviation amount.

27. The scanning exposure apparatus according to claim 26, wherein said predetermined point on the mask is changed in said one-dimensional scanning direction according to the scanning position of the mask.

28. The scanning exposure apparatus according to claim 23, wherein said first driving system includes a mask side linear motor for driving said first mask stage supported by an air-guide structure and a plate side linear motor for driving said plate stage supported by an air-guide structure.

29. A scanning exposure apparatus for projecting a pattern image of a mask onto a sensitive plate through a projection system having a predetermined magnification ratio in a scanning manner, the apparatus comprising:

(a) a scanning system for synchronously, relatively scanning the mask and the plate with respect to a projection field of said projection system at a velocity ratio corresponding to said magnification ratio during the scanning exposure;

(b) a finely movable stage provided on said scanning system for finely moving the mask relative to said scanning system in each of translational and rotational directions;

(c) a detecting system for detecting a positional deviation amount between an ideal positional relation and an actual positional relation of the mask and the plate during the scanning exposure; and (d) a control system for driving said finely movable stage based on said detected deviation amount in order to decrease the positional deviation of the mask and the plate.

30. A scanning exposure method in which a pattern area of a mask is transferred onto a sensitive plate through a projection optical system in a scanning manner, the method comprising the steps of:

(a) irradiating the mask with a radiation having a slit shaped intensity distribution in order to project a slit image portion of said pattern area of the mask toward the plate through said projection optical system;

(b) synchrouously scanning each of the mask and the plate relative to said projection optical system in a scanning direction perpendicular to a longitudinal direction of said slit image portion at a predetermined velocity ratio by using a scanning mechanism for the scanning exposure;

(c) detecting a deviation value between an ideal positional relation and an actual positional relation of the mask and the plate at a term of the scanning exposure; and (d) correcting a position of the mask determined by said scanning mechanism so as to decrease said detected deviation value by using a fine moving mechanism provided on said scanning mechanism at the term of the scanning exposure.

31. The scanning exposure method according to claim 30, wherein said detecting step includes detecting a relative rotational deviation between the mask and the plate and said fine moving mechanism finely rotates the mask to decrease said rotational deviation.

32. The scanning exposure method according to claim 31, wherein said relative rotational deviation is detected by using a mask side interferometer system and a plate side interferometer system.

33. A scanning exposure method in which a pattern area of a mask is transferred onto a sensitive plate through a projection system in a scanning manner, the method comprising the steps of:

(a) irradiating the mask with a radiation in order to project an image portion of said pattern area of the mask onto the plate through said projection system;

(b) synchronously scanning each of the mask and the plate relative to said projection system in a scanning direction at a predetermined velocity ratio by using a scanning mechanism for the scanning exposure;

(c) detecting a deviation between an ideal positional relation and an actual positional relation of the mask and the plate at a term of the scanning exposure; and (d) correcting a position of the mask determined by said scanning mechanism for decreasing said detected deviation by using a fine moving mechanism provided on said scanning mechanism at the term of the scanning exposure.

34. A scanning exposure apparatus for projecting a pattern image of a mask onto a sensitive plate through a projection system in a scanning manner, the exposure apparatus comprising:

(a) a plate stage for moving the plate under said projection system in an X direction for the scanning exposure and in a Y direction perpendicular to the X direction;

(b) a first mask stage for moving the mask in the X direction for the scanning exposure above said projection system;

(c) a second mask stage for finely moving the mask on said first mask stage in each of translational and rotational directions;

(d) first driving means for synchronously driving each of said plate stage and said first mask stage with a predetermined velocity ratio in the X direction during the scanning exposure; and (e) second driving means for driving said plate stage and said second mask stage to maintain a translational relation of the mask and plate in the Y direction and for driving said second mask stage to maintain a relative rotational relation of the mask and the plate, during the scanning exposure.

* * * * *